US009437645B1

United States Patent
Chou et al.

(10) Patent No.: US 9,437,645 B1
(45) Date of Patent: Sep. 6, 2016

(54) COMPOSITE GRID STRUCTURE TO REDUCE CROSS TALK IN BACK SIDE ILLUMINATION IMAGE SENSORS

(71) Applicant: Taiwan Semiconductor Manufacturing Co., Ltd., Hsin-Chu (TW)

(72) Inventors: Keng-Yu Chou, Kaohsiung (TW); Chun-Hao Chuang, Hsinchu (TW); Chien-Hsien Tseng, Hsinchu (TW); Shyh-Fann Ting, Tainan (TW); Wei-Chieh Chiang, Yuanlin Township (TW); Yuichiro Yamashita, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/663,918

(22) Filed: Mar. 20, 2015

(51) Int. Cl.
*H01L 27/146* (2006.01)

(52) U.S. Cl.
CPC ..... *H01L 27/14645* (2013.01); *H01L 27/1463* (2013.01); *H01L 27/1464* (2013.01); *H01L 27/14621* (2013.01); *H01L 27/14627* (2013.01); *H01L 27/14685* (2013.01); *H01L 27/14689* (2013.01)

(58) Field of Classification Search
CPC ........... H01L 27/146; H01L 27/14643; H01L 27/24645; H01L 27/14621; H01L 27/14625
See application file for complete search history.

(56) References Cited

U.S. PATENT DOCUMENTS

| 7,138,618 | B2 | 11/2006 | Mishina et al. | |
|---|---|---|---|---|
| 8,828,779 | B2 | 9/2014 | Zhao | |
| 2012/0268631 | A1 | 10/2012 | Takase et al. | |
| 2013/0134536 | A1 | 5/2013 | Mori et al. | |
| 2015/0035102 | A1* | 2/2015 | Ashidate | H01L 27/1463 257/432 |
| 2015/0048467 | A1* | 2/2015 | Weng | H01L 31/0232 257/432 |
| 2015/0155322 | A1* | 6/2015 | Ting | H01L 27/14625 257/443 |
| 2015/0171125 | A1* | 6/2015 | Jangjian | H01L 27/14627 257/432 |

OTHER PUBLICATIONS

U.S. Appl. No. 14/100,598, filed with the USPTO on Dec. 9, 2013.
Non-Final Office Action dated Mar. 15, 2016 for U.S. Appl. No. 14/688,106.

* cited by examiner

*Primary Examiner* — Phuc Dang
(74) *Attorney, Agent, or Firm* — Eschweiler & Associates, LLC

(57) ABSTRACT

A semiconductor structure for back side illumination (BSI) pixel sensors is provided. Photodiodes are arranged within a semiconductor substrate. A composite grid includes a metal grid and a low refractive index (low-n) grid. The metal grid includes first openings overlying the semiconductor substrate and corresponding to ones of the photodiodes. The low-n grid includes second openings overlying the semiconductor substrate and corresponding to ones of the photodiodes. Color filters are arranged in the first and second openings of the corresponding photodiodes and have a refractive index greater than a refractive index of the low-n grid. Upper surfaces of the color filters are offset relative to an upper surface of the composite grid. A method for manufacturing the BSI pixel sensors is also provided.

20 Claims, 16 Drawing Sheets

COMPOSITE GRID STRUCTURE TO REDUCE CROSS TALK IN BACK SIDE ILLUMINATION IMAGE SENSORS

BACKGROUND

Digital cameras and other optical imaging devices employ image sensors. Image sensors convert optical images to digital data that may be represented as digital images. An image sensor includes an array of pixel sensors and supporting logic. The pixel sensors of the array are unit devices for measuring incident light, and the supporting logic facilitates readout of the measurements. One type of image sensor commonly used in optical imaging devices is a back side illumination (BSI) image sensor. BSI image sensor fabrication can be integrated into conventional semiconductor processes for low cost, small size, and high integration. Further, BSI image sensors have low operating voltage, low power consumption, high quantum efficiency, low read-out noise, and allow random access.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
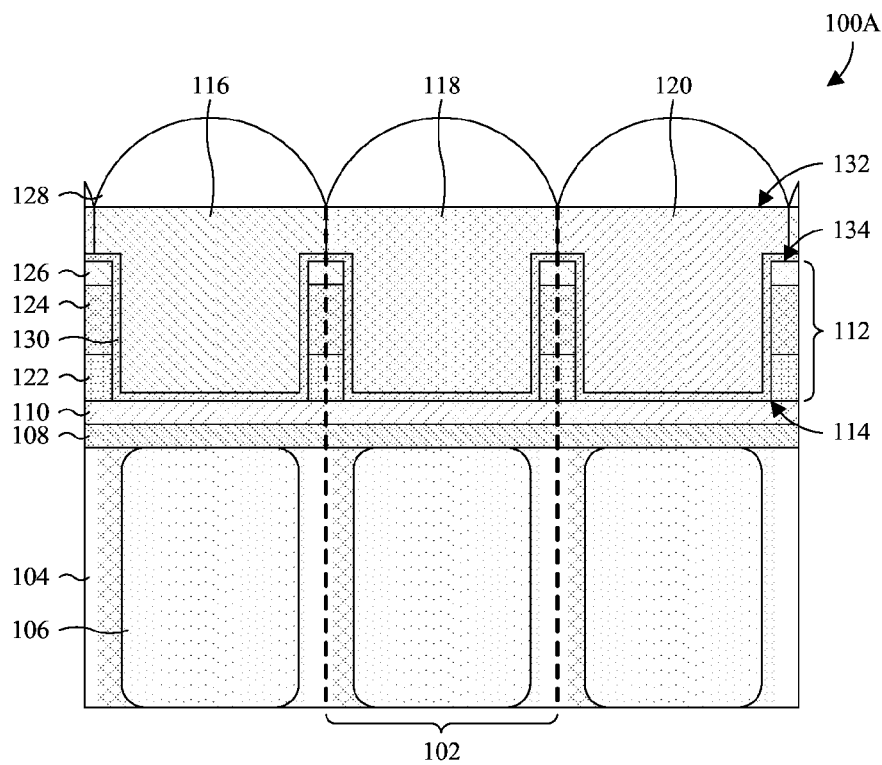
FIG. 1A illustrates a cross-sectional view of some embodiments of a semiconductor structure for aligned back side illumination (BSI) pixel sensors.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Moreover, "first", "second", "third", etc. may be used herein for ease of description to distinguish between different elements of a figure or a series of figures. "first", "second", "third", etc. are not intended to be descriptive of the corresponding element. Therefore, "a first dielectric layer" described in connection with a first figure may not necessarily corresponding to a "first dielectric layer" described in connection with another figure.

As the size of BSI image sensors decrease, BSI image sensors face a number of challenges. One challenge with BSI image sensors is cross talk between neighboring pixel sensors. As BSI image sensors become smaller and smaller, the distance between neighboring pixel sensors becomes smaller and smaller, thereby increasing the likelihood of cross talk. Cross talk reduces quantum efficiency, angular response, and the minimum luminance needed to achieve a good signal-to-noise ratio (SNR). Another challenge with BSI image sensors is light collection. As BSI image sensors become smaller and smaller, the surface area for light collection becomes smaller and smaller, thereby reducing the sensitivity of pixel sensors. This is problematic for low light environments.

In view of the foregoing, the present application is directed to a semiconductor structure of a BSI image sensor with improved optical isolation between pixel sensors or improved light collection. The semiconductor structure includes a semiconductor substrate and photodiodes arranged in the substrate. Further, the semiconductor structure includes color filters corresponding to the photodiodes, arranged on a back side of the semiconductor substrate. A composite grid is further arranged around and between the color filters, and includes a metal grid and a low refractive index (low-n) grid overlying the metal grid. The low-n grid has a refractive index less than the color filters, thereby isolating neighboring color filters and serving as a light guide to increase the effective size of the color filters (e.g., by directing incident light on sides of the color filters to centers of the color filters). The metal grid blocks light, thereby isolating neighboring color filters and reducing cross talk. The color filters further have upper surfaces offset relative to an upper surface of the composite grid.

Offsetting the upper surface of the color filters relative to an upper surface of the composite grid allows for mitigation of some of the challenges faced by BSI image sensors. For example, in some embodiments, the upper surfaces of the color filters are recessed relative to the upper surface of the composite grid. Recessing the upper surfaces of the color filters advantageously improves quantum efficiency because the low-n grid is transparent and more light will be collected by the low-n grid. This improves angular response, and the minimum luminance needed to achieve a good SNR of 10 under oblique incident light. In other embodiments, the upper surfaces of the color filters are higher than, and overhang, the upper surface of the composite grid. Recessing the upper surface of the composite grid relative to the upper surfaces of the color filters reduces cross talk because the low-n grid acts as a light guide.

With reference to FIG. 1A, a cross-sectional view 100A of some embodiments of a semiconductor structure for aligned BSI pixel sensors 102 is provided. The pixel sensors 102 are typically arranged within a pixel sensor array of a BSI image sensor, and are typically arranged at a center of the pixel sensor array. The semiconductor structure includes a semiconductor substrate 104 within which photodiodes 106 corresponding to the pixel sensors 102 are arranged. The photodiodes 106 are arranged in rows and/or columns within the semiconductor substrate 104, and are configured to accumulate charge (e.g., electrons) from photons incident on the photodiodes 106. The semiconductor substrate 104 may be, for example, a bulk semiconductor substrate, such as a bulk silicon substrate, or a silicon-on-insulator (SOI) substrate.

An antireflective coating (ARC) 108, and/or a first dielectric layer 110, are arranged over the semiconductor substrate 104 along an upper surface of the semiconductor substrate 104. In embodiments where both the ARC 108 and the first dielectric layer 110 are present, the first dielectric layer 110 is typically arranged over the ARC 108. The ARC 108 and/or the first dielectric layer 110 space the semiconductor substrate 104 from a composite grid 112 that overlies the substrate 104. The first dielectric layer 110 may be, for example, an oxide, such as silicon dioxide.

The composite grid 112 is laterally arranged around and between the photodiodes 106 to define openings 114 within which color filters 116, 118, 120 are arranged. The openings 114 correspond to the pixel sensors 102 and are centered on centers of the photodiodes 106. The composite grid 112 may include a metal grid 122, a low-n grid 124, and/or a hard mask grid 126 stacked in that order over the semiconductor substrate 104. The metal grid 122 blocks light from passing between neighboring pixel sensors 102 to help reduce cross talk. The metal grid 122 may be, for example, tungsten, copper, or aluminum copper. The low-n grid 124 is a transparent material with a refractive index less than a refractive index of the color filters 116, 118, 120. Due to the low refractive index, the low-n grid 124 serves as a light guide to direct light to the color filters 116, 118, 120. Directing light along sides of the color filters 116, 118, 120 (in addition to light incident on top of the color filters 116, 118, 120), the light guide effectively increases the size of the color filters 116, 118, 120. Further, due to the low refractive index, the low-n grid 124 serves to provide optical isolation between neighboring pixel sensors 102. In some embodiments, the low-n grid 124 is a dielectric, such as an oxide (e.g., $SiO_2$) or hafnium oxide (e.g., $HfO_2$), or a material with a refractive index less than color filter. The hard mask grid 126 may be, for example, silicon nitride or silicon oxynitride.

The color filters 116, 118, 120 are arranged over the ARC 108 and/or the first dielectric layer 110, and covered by micro lenses 128. The micro lenses 128 are centered on centers of the photodiodes 106. Further, the color filters 116, 118, 120 are arranged over the photodiodes 106 of corresponding pixel sensors 102 within the openings 114 of the composite grid 112, and spaced from the composite grid 112 by a second dielectric layer 130 lining the composite grid 112. The second dielectric layer 130 may be, for example, an oxide. The color filters 116, 118, 120 have upper surfaces 132 that are higher than an upper surface 134 of the composite grid 112 and that overhang the composite grid 112 around the openings 114. This advantageously reduces cross talk between neighboring pixel sensors 102 since less light will be collected by the low-n grid 124. Further, the color filters 116, 118, 120 are assigned corresponding colors or wavelengths of light, and configured to filter out all but the assigned colors or wavelengths of light. Typically, the color filter assignments alternate between red, green, and blue light, such that the color filters 116, 118, 120 include red color filters 116, green color filters 118, and blue color filters 120. In some embodiments, the color filter assignments alternative between red, green, and blue light according to a Bayer filter mosaic.

Figure 1B:
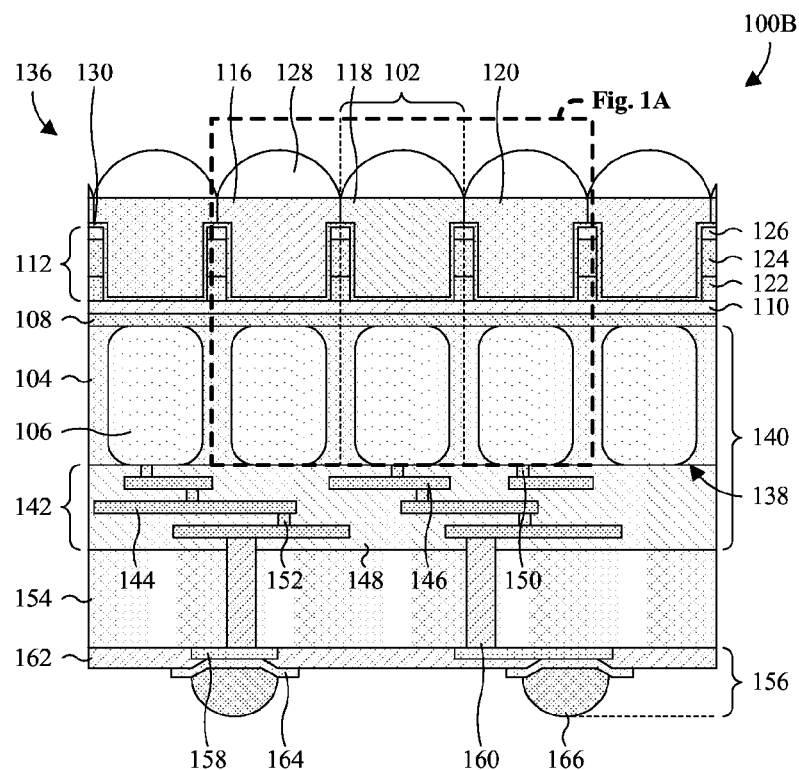
FIG. 1B illustrates a cross-sectional view of some embodiments of a semiconductor structure for a BSI image sensor package including the pixel sensors of FIG. 1A.

With reference to FIG. 1B, a cross-sectional view 100B of some embodiments of a semiconductor structure for a BSI image sensor package 136 is provided. The BSI image sensor package 136 includes an array 138 of pixel sensors 102 arranged in rows and columns on a first, back side of an integrated circuit 140. In some embodiments, the pixel sensor array 138 includes the pixel sensors 102 of FIG. 1A, typically arranged at a center of the pixel sensor array 138. Further, in some embodiments, the pixel sensor array 138 includes millions of pixel sensors, and/or hundreds, if not thousands, of rows and columns. For example, the pixel sensor array 138 may include about 3 million pixel sensors arranged in 1536 rows and 2048 columns.

The integrated circuit 140 includes an array of photodiodes 106 arranged in rows and columns within the semiconductor substrate 104, and configured to accumulate charge from photons incident on the photodiodes 106. Logic devices (not shown), such as transistors, are arranged along a lower surface of the semiconductor substrate 104 and are configured to enable readout of the photodiodes 106.

A BEOL metallization stack 142 underlies the semiconductor substrate 104 and includes a plurality of metallization layers 144, 146 stacked within an interlayer dielectric (ILD) layer 148. One or more contacts 150 of the BEOL metallization stack 142 extend from a metallization layer 146 to the logic devices. Further, one or more first vias 152 of the BEOL metallization stack 142 extend between the metallization layers 144, 146 to interconnect the metallization layers 144, 146. The ILD layer 148 may be, for example, a low κ dielectric (i.e., a dielectric with a dielectric constant less than about 3.9) or an oxide. The metallization layers 144, 146, the contacts 150, and the first vias 152 may be, for example, a metal, such as copper, tungsten, or aluminum.

A carrier substrate 154 is located between the integrated circuit 140 and a ball grid array (BGA) 156. The BGA 156 includes a redistribution layer (RDL) 158 arranged along a lower surface of the carrier substrate 154 and electrically coupled to the metallization layers 144, 146 of the BEOL metallization stack 142 through one or more second, through silicon vias 160 extending through the carrier substrate 154. The RDL 158 is covered by a BGA dielectric layer 162, and under bump metallization (UBM) layers 164 extend through the BGA dielectric layer 162 to electrically couple solder balls 166 underlying the UBM layers 164 to the RDL 158. The BGA dielectric layer 162 may be, for example, an epoxy. The RDL 158, the UBM layers 164, the second vias 160, and the solder balls 166 may be, for example, metals, such as copper, aluminum, and tungsten.

Figure 2:
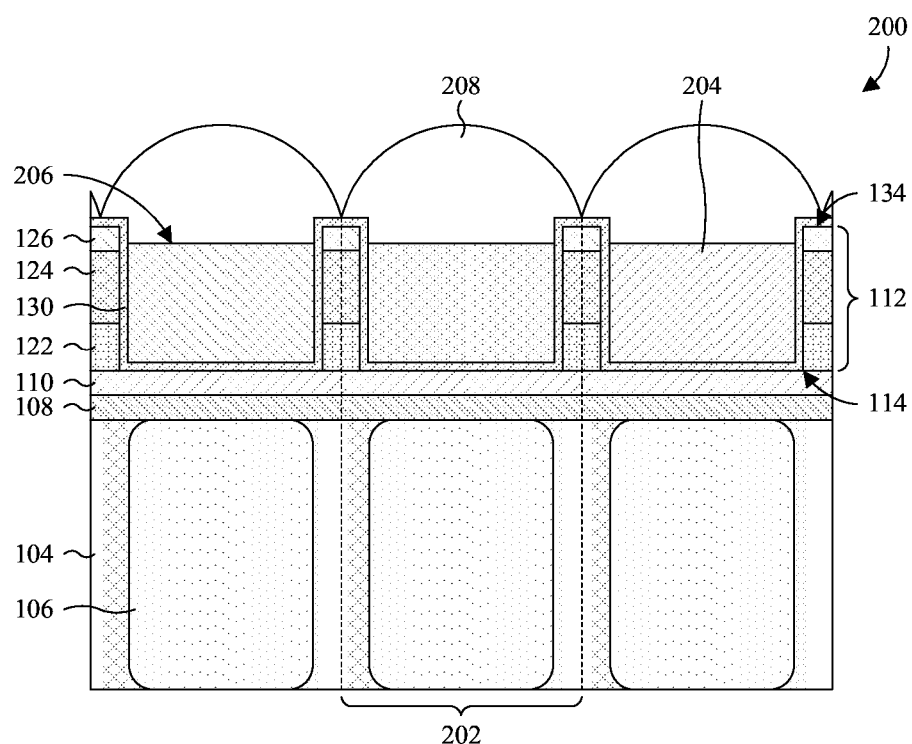
FIG. 2 illustrates a cross-sectional view of other embodiments of a semiconductor structure for aligned BSI pixel sensors.

With reference to FIG. 2, a cross-sectional view 200 of other embodiments of a semiconductor structure for aligned BSI pixel sensors 202 is provided. Color filters 204 corresponding to the pixel sensors 202 are arranged over photodiodes 106 in openings 114 of a composite grid 112. The openings 114 are centered over the photodiodes 106. The color filters 204 partially fill the openings 114 and have upper surfaces 206 recessed relative to an upper surface 134 of the composite grid 112. This is to be contrasted with the embodiments of FIG. 1A. The recessed upper surfaces 206 advantageously improve light collection since a low-n grid 124 of the composite grid 112 serves as a light guide to effectively increase the size of the color filters 204. Micro lenses 208 are arranged over and centrally aligned with the color filters 204, and with the photodiodes 106. The micro lenses 208 fill a remainder of the openings 114 and overhang the composite grid 112 around the openings 114.

Figure 3:
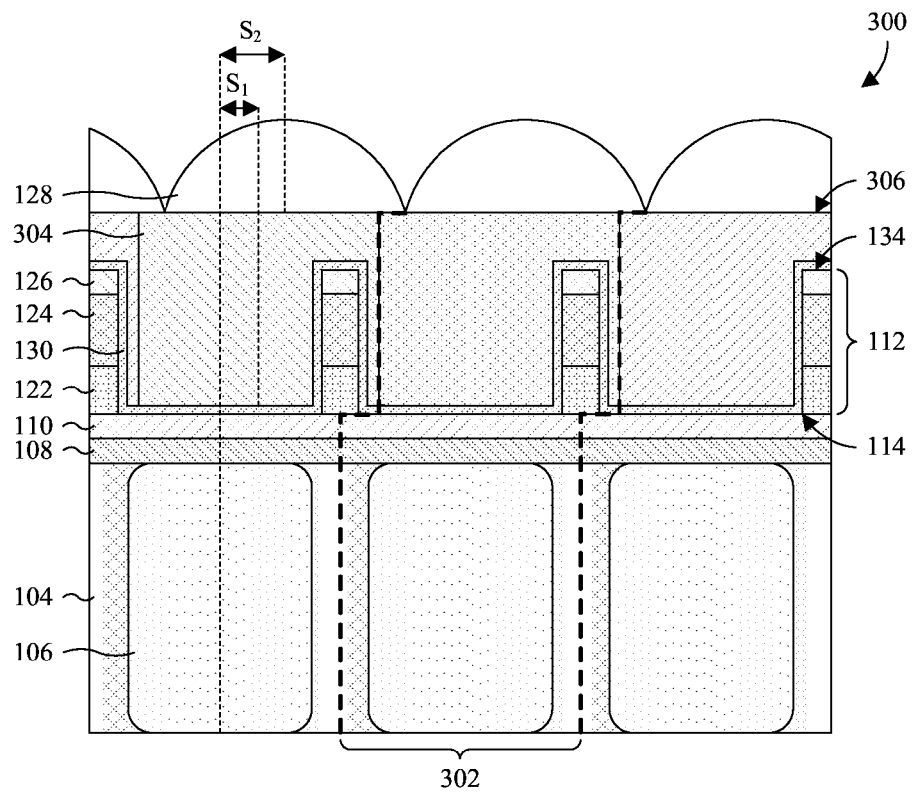
FIG. 3 illustrates a cross-sectional view of first embodiments of a semiconductor structure for shifted BSI pixel sensors.

With reference to FIG. 3, a cross-sectional view 300 of first embodiments of a semiconductor structure for shifted BSI pixel sensors 302 is provided. The pixel sensors 302 are typically arranged at an edge of a pixel sensor array of a BSI image sensor or otherwise offset from the center of the pixel sensor array. For example, the pixel sensors 302 may be arranged at an edge of the pixel sensor array 138 of FIG. 1B. The pixel sensors 302 include corresponding color filters 304 and corresponding micro lenses 128. The color filters 304 are arranged over photodiodes 106 in openings 114 of a composite grid 112. The composite grid 112 is laterally arranged around and between the photodiodes 106 to define the openings 114. The color filters 304 have upper surfaces 306 above an upper surface 134 of the composite grid 112 and that overhang the upper surface 134 of the composite grid 112 in at least one direction. The micro lenses 128 are arranged over the color filters 304, and the photodiodes 106. Further, the micro lenses 128 overhang the upper surface 134 of the composite grid 112 in the at least one direction.

The color filters 304 are laterally shifted or offset from the photodiodes 106 in the at least one direction by an amount $S_1$, and the micro lenses 128 are laterally shifted or offset from the photodiodes 302 in the at least one direction by an amount $S_2$. Typically, the shift amount $S_2$ is greater than the shift amount $S_1$. The shift amounts $S_1$, $S_2$ may be, for example, between centers of the photodiodes 106, the micro lenses 128, and the color filters 304. Further, the shift amounts $S_1$ and $S_2$ may be, for example, proportional to distance from a center of a pixel sensor array to improve pixel efficiency where the chief ray angle of incoming light is not normal or perpendicular. In some embodiments, depending upon the shift amount $S_1$, the color filters 304 may partially fill first openings in the composite grid 112 that overly a first photodiode 106 and may partially fill second openings in the composite grid 112 that overly a neighboring second photodiode 106. Further, in some embodiments, depending upon the shift amount $S_2$, the micro lenses 128 may partially overly a first photodiode and may partially overly a neighboring second photodiodes.

Figure 4:
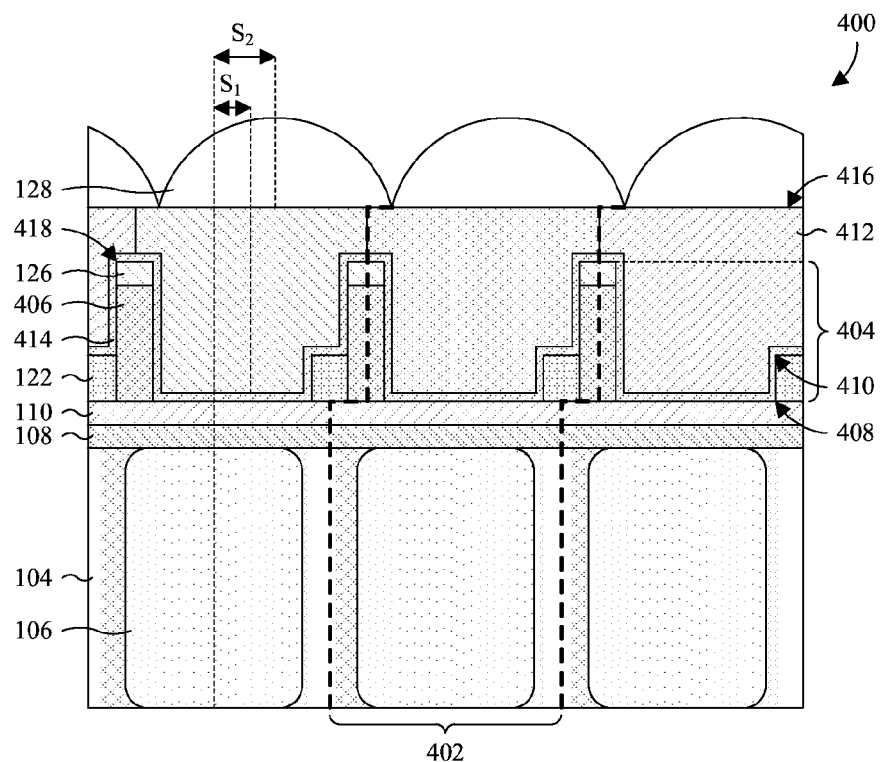
FIG. 4 illustrates a cross-sectional view of second embodiments of a semiconductor structure for shifted BSI pixel sensors.

With reference to FIG. 4, a cross-sectional view 400 of second embodiments of a semiconductor structure for shifted BSI pixel sensors 402 is provided. The BSI pixel sensors 402 are typically arranged at an edge of a pixel sensor array of a BSI image sensor or otherwise offset from the center of the pixel sensor array. A composite grid 404 includes a metal grid 122, a Low-n grid 406, and a hard mask grid 126. The metal grid 122 is laterally arranged around and between photodiodes 106 corresponding to the pixel sensors 402 to define first openings 408 corresponding to the pixel sensors 402. The first openings 408 are centrally aligned with the photodiodes 106 over the photodiodes 106. The low-n grid 406 shares a layout with the metal grid 122, but is laterally shifted in at least one direction so the low-n grid 406 neighbors the metal grid 122 with sidewalls of the low-n grid 406 abutting sidewalls of the metal grid 122. The hard mask grid 126 overlies the low-n grid 406, and the low-n grid 406 and the hard mask grid 126 define second openings 410. The second openings 410 overlap with the first openings 408, and partially overly the photodiodes 106.

Color filters 412 are arranged over the photodiodes 106 within the first and second openings 408, 410. The color filters 412 are spaced from the composite grid 404 by a second dielectric layer 414 lining the composite grid 404. Further, the color filters 412 include upper surfaces 416 above an upper surface 418 of the composite grid 404 and overhanging the composite grid 404 around the second openings 410. Due to the shift in the low-n grid 406, the color filters 412 are laterally shifted or offset from the photodiodes 106 in the at least one direction by an amount $S_1$ and have a stepped profile. Micro lenses 128 are arranged over the color filters 412, and laterally shifted or offset from the photodiodes 106 in the at least one direction by an amount $S_2$.

Figure 5:
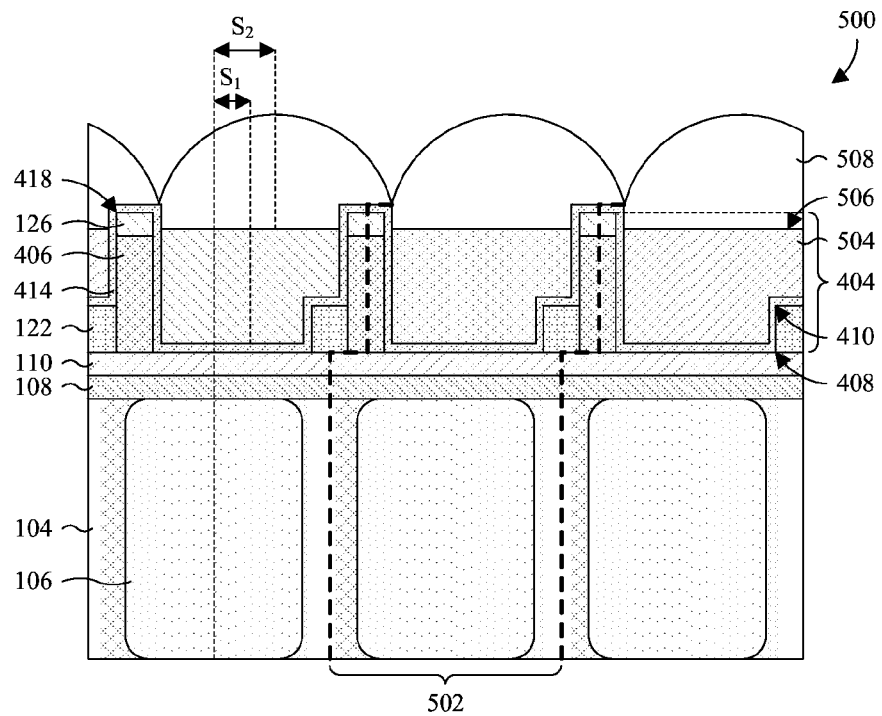
FIG. 5 illustrates a cross-sectional view of other second embodiments of a semiconductor structure for shifted BSI pixel sensors.

With reference to FIG. 5, a cross-sectional view 500 of other second embodiments of a semiconductor structure for aligned BSI pixel sensors 502 is provided. Color filters 504 are arranged over photodiodes 106 within first and second openings 408, 410 of a composite grid 404. The color filters 504 include upper surfaces 506 recessed relative to an upper surface 418 of the composite grid 404. This is to be contrasted with the embodiments of FIG. 4. Further, the color filters 504 are laterally shifted or offset from the photodiodes 106 in least one direction by an amount $S_1$. Micro lenses 508 corresponding to the pixel sensors are arranged over the color filters 412, and laterally shifted or offset from the photodiodes 106 in the least one direction by an amount $S_2$.

Figure 6:
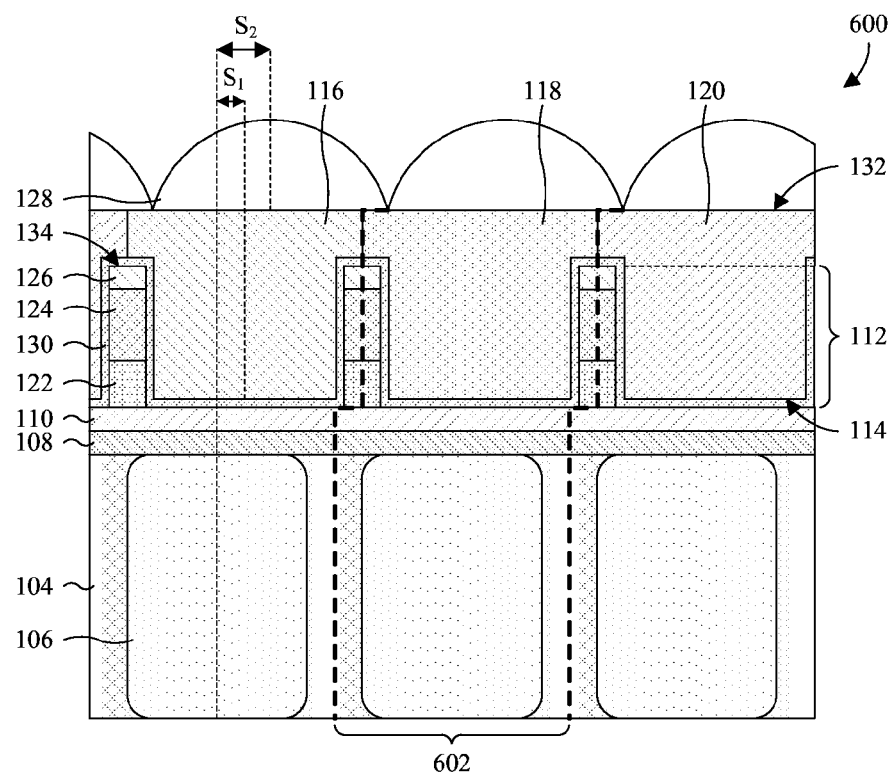
FIG. 6 illustrates a cross-sectional view of third embodiments of a semiconductor structure for shifted BSI pixel sensors.

With reference to FIG. 6, a cross-sectional view 600 of third embodiments of a semiconductor structure for shifted BSI pixel sensors 602 is provided. The pixel sensors 602 are typically arranged at an edge of a pixel sensor array of a BSI image sensor or otherwise offset from the center of the pixel sensor array. A composite grid 112 is arranged around and between openings 114 corresponding to photodiodes 106 of corresponding pixel sensors 602. Further, the composite grid 112, and color filters 116, 118, 120 arranged in the openings 114, are laterally shifted or offset from the photodiodes 106 in at least one direction by an amount $S_1$ so the openings 114 partially overlap the photodiodes 106 of the corresponding pixel sensors 602. The color filters 116, 118, 120 include upper surfaces 132 above an upper surface 134 of the composite grid 112 and overhanging the composite grid 112 around the openings 114. Micro lenses 128 are arranged over the color filters 116, 118, 120, and laterally shifted or offset from the photodiodes 106 in the at least one direction by an amount $S_2$.

Figure 7:
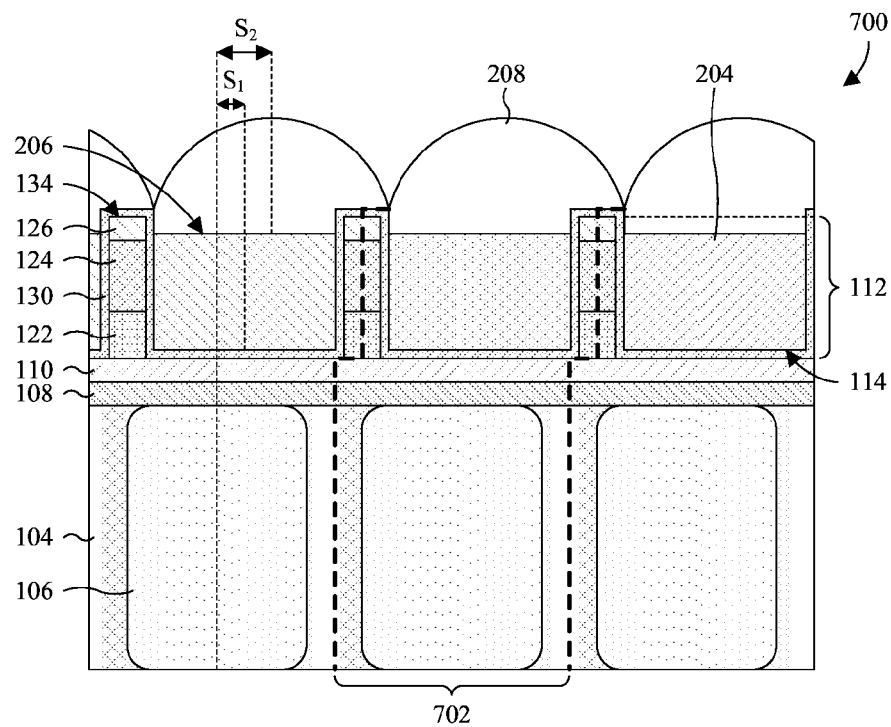
FIG. 7 illustrates a cross-sectional view of other third embodiments of a semiconductor structure for shifted BSI pixel sensors.

With reference to FIG. 7, a cross-sectional view 700 of other third embodiments of a semiconductor structure for shifted BSI pixel sensors 702 is provided. Color filters 204 corresponding to the pixel sensors 702 are arranged over photodiodes 106 within openings 114 of a composite grid 112. The color filters 204 include upper surfaces 206 recessed relative to an upper surface 134 of the composite grid 112. This is to be contrasted with the embodiments of FIG. 6. Further, the color filters 204 are laterally shifted or offset from the photodiodes 106 in at least one direction by an amount $S_1$. Micro lenses 208 are arranged over the color filters 204, and laterally shifted or offset from the photodiodes 106 in the at least one direction by an amount $S_2$.

Figure 8:
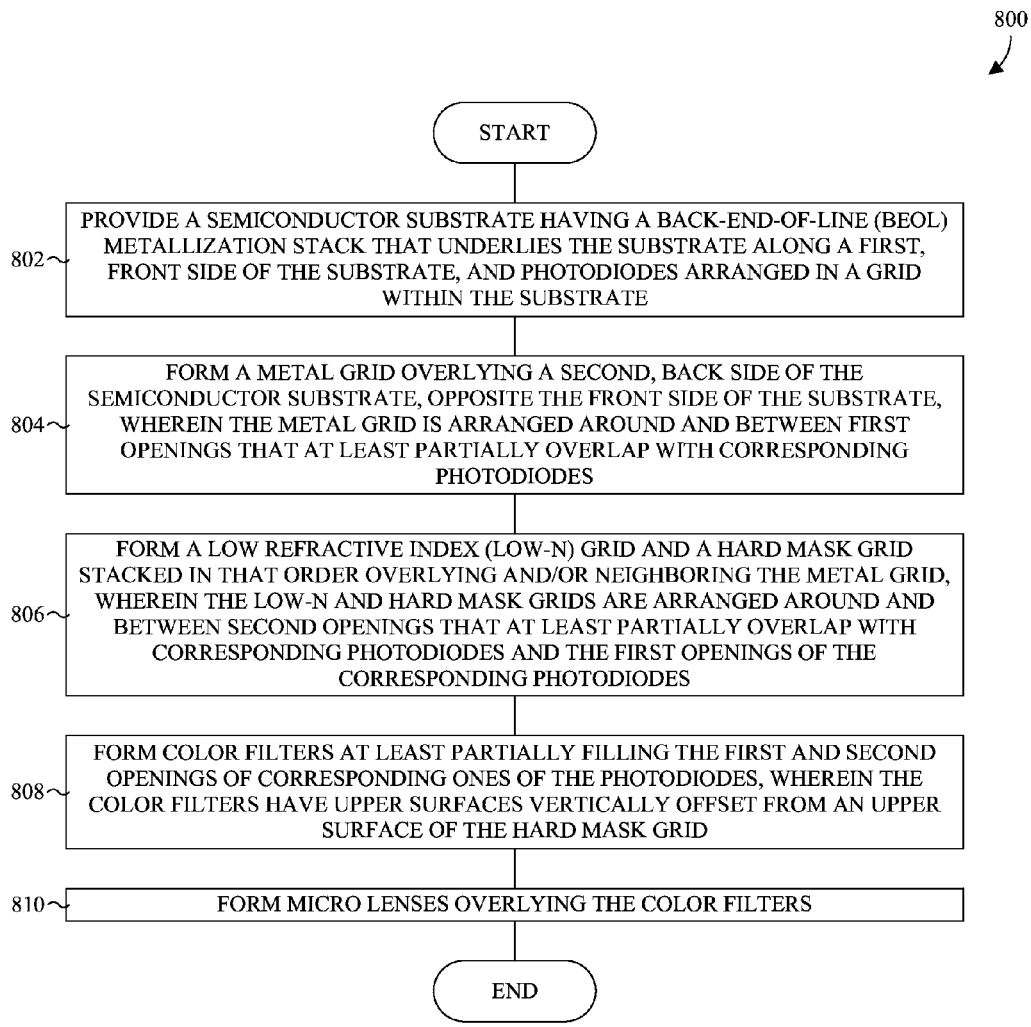
FIG. 8 illustrates a flowchart of some embodiments of a method for manufacturing a semiconductor structure for BSI pixel sensors.

With reference to FIG. 8, a flowchart 800 of some embodiments of a method for manufacturing a semiconductor structure for BSI pixel sensors is provided.

At 802, a semiconductor substrate and a BEOL metallization stack are provided. The BEOL metallization stack underlies the semiconductor substrate along a first, front side of the substrate, and photodiodes are arranged in a grid within the semiconductor substrate.

At 804, a metal grid is formed overlying a second, back side of the semiconductor substrate, opposite the front side of the substrate. The metal grid is arranged around and between first openings corresponding to the photodiodes, where the first openings at least partially overlap with the corresponding photodiodes.

At 806, a low-n grid and a hard mask grid are formed stacked in that order overlying and/or neighboring the metal grid. Further, the low-n grid and the hard mask grid are formed around and between second openings corresponding to the photodiodes. The second openings at least partially overlap with the corresponding photodiodes and the first openings of the corresponding photodiodes. The low-n grid has a refractive index less than color filters formed hereafter, and therefore serves as a light guide to increase light collection. Further, the low-n grid provides optical isolation and reduces cross talk between neighboring pixel sensors.

At 808, color filters at least partially filling the first and second openings of corresponding ones of the photodiodes are formed. The color filters are formed with upper surfaces vertically offset from an upper surface of the hard mask grid. In some embodiments, the color filters overhang the low-n grid. In such embodiments, light collection by the low-n grid is advantageously reduced, thereby reducing cross talk between neighboring pixel sensors. In other embodiments, the upper surfaces of the color filters are recessed relative to the upper surface of the hard mask grid. In such embodiments, light collection by the low-n grid is advantageously increased, thereby increasing the effective size of the color filters.

At 810, micro lenses are formed overlying the color filters.

While the method described by the flowchart 800 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

Figure 9:
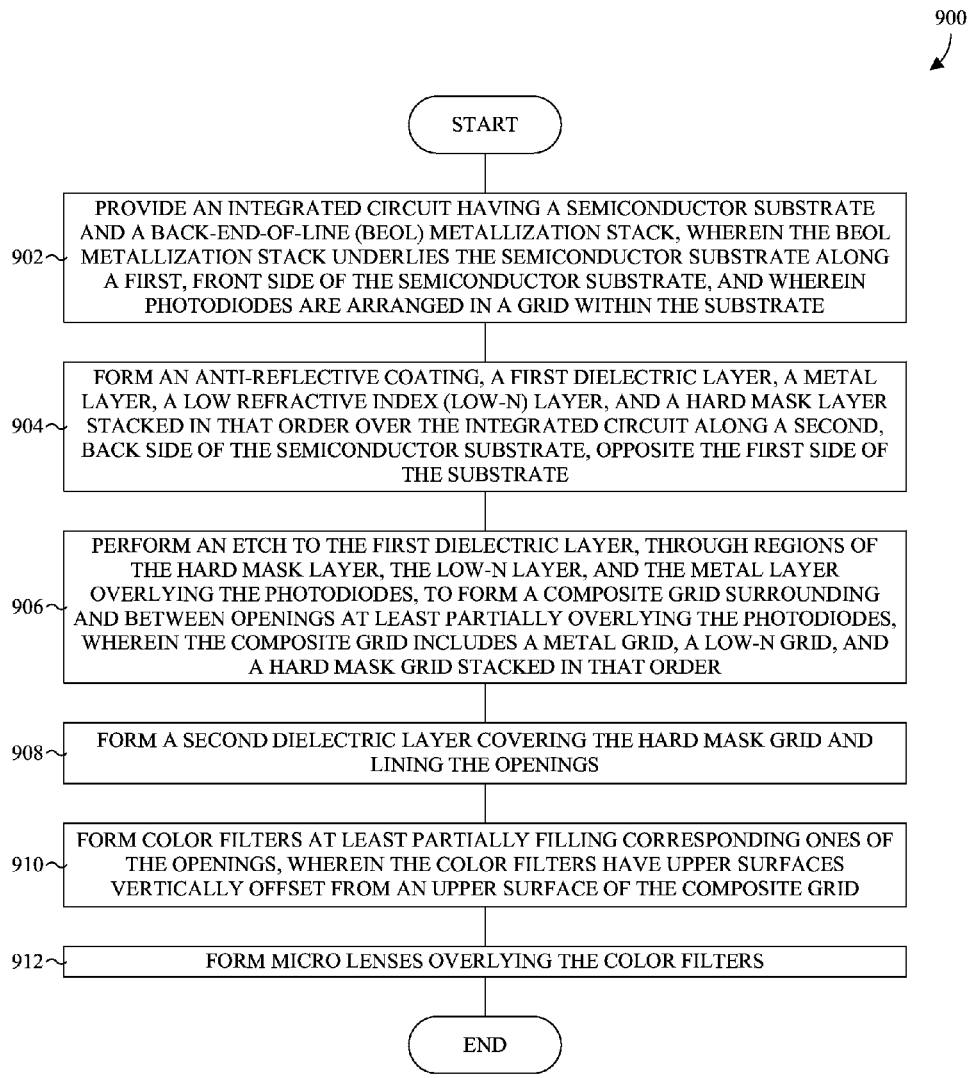
FIG. 9 illustrates a flowchart of more detailed embodiments of the method of FIG. 8 in which a semiconductor structure for aligned BSI pixel sensors is manufactured.

With reference to FIG. 9, a flowchart 900 of more detailed embodiments of the method of FIG. 8 is provided. As seen hereafter, the more detailed embodiments are directed to aligned BSI pixel sensors.

At 902, an integrated circuit having a semiconductor substrate and a BEOL metallization stack is provided. The BEOL metallization stack underlies the semiconductor substrate along a first, front side of the semiconductor substrate, and photodiodes are arranged in a grid within the substrate.

At 904, an anti-reflective coating, a first dielectric layer, a metal layer, a low-n layer, and a hard mask layer are formed stacked in that order over the integrated circuit. The stack is formed along a second, back side of the semiconductor substrate, opposite the first side of the substrate, and the low-n grid has a refractive index less than color filters formed hereafter.

At 906, an etch is performed to the first dielectric layer, through regions of the hard mask layer, the low-n layer, and the metal layer overlying the photodiodes, to form a composite grid surrounding and between openings at least partially overlying the photodiodes. The composite grid includes a metal grid, a low-n grid, and a hard mask grid stacked in that order.

At 908, a second dielectric layer is formed covering the hard mask grid and lining the openings.

At 910, color filters at least partially filling corresponding ones of the openings are formed. The color filters have upper surfaces vertically offset from an upper surface of the composite grid. For example, the color filters overhang the composite grid or the upper surfaces of the color filters are recessed relative to the upper surface of the composite grid.

At 912, micro lenses are formed overlying the color filters.

With reference to FIGS. 10-13, 14A & B, and 15A & B, cross-sectional views of some embodiments of a semiconductor structure for BSI pixel sensors at various stages of manufacture are provided to illustrate the method of FIG. 9. Although FIGS. 10-13, 14A & B, and 15A & B are described in relation to the method, it will be appreciated that the structures disclosed in FIGS. 10-13, 14A & B, and 15A & B are not limited to the method, but instead may stand alone as structures independent of the method. Similarly, although the method is described in relation to FIGS. 10-13, 14A & B, and 15A & B, it will be appreciated that the method is not limited to the structures disclosed in FIGS. 10-13, 14A & B, and 15A & B, but instead may stand alone independent of the structures disclosed in FIGS. 10-13, 14A & B, and 15A & B.

Figure 10:
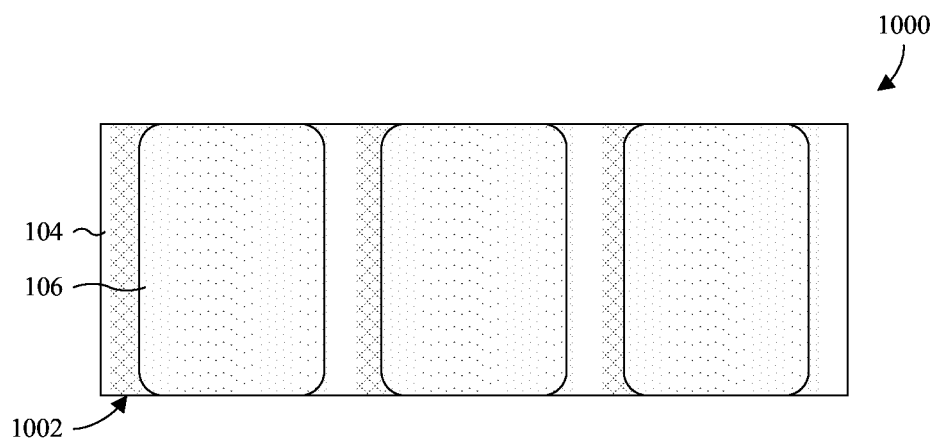
FIGS. 10-13, 14A & B, and 15A & B illustrate a series of cross-sectional views of some embodiments of the semiconductor structure of FIG. 9 at various stages of manufacture.

FIG. 10 illustrates a cross-sectional view 1000 of some embodiments corresponding to Act 902. As illustrated, a semiconductor substrate 104 with photodiodes 106 arranged therein is provided. The photodiodes 106 correspond to pixel sensors and are typically arranged in columns and/or rows within the semiconductor substrate 104. In some embodiments, the semiconductor substrate 205 is part of an integrated circuit. In such embodiments, a BEOL metallization stack (not shown) of the integrated circuit underlies the semiconductor substrate 104 along a first, front side 1002 of the substrate 104. Further, the photodiodes 106 partially define a device region of the integrated circuit that is electrically connected to the BEOL metallization stack. The semiconductor substrate 104 may be, for example, a bulk semiconductor substrate.

Figure 11:
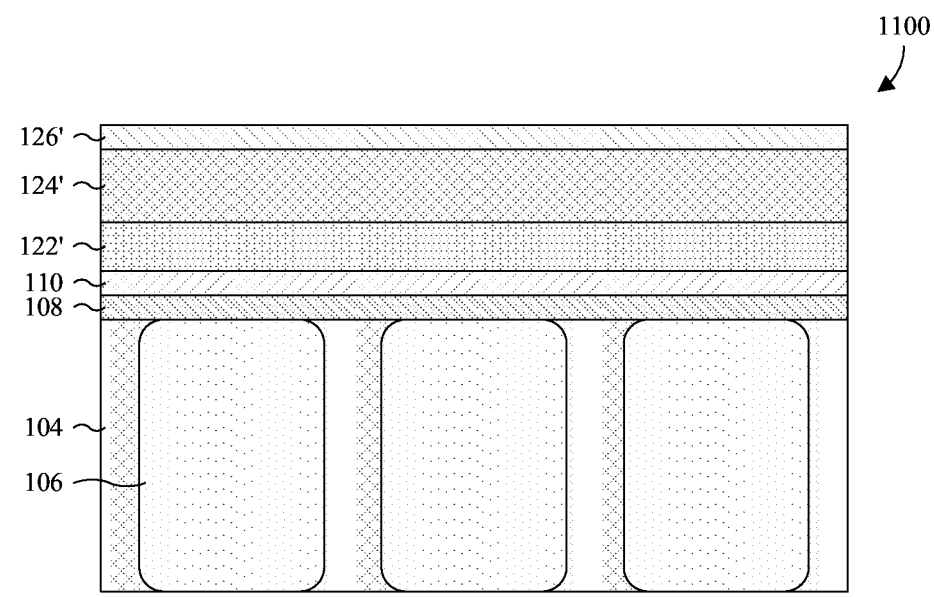

FIG. 11 illustrates a cross-sectional view 1100 of some embodiments corresponding to Act 904. As illustrated, an ARC 108, a first dielectric layer 110, a metal layer 112', a low-n layer 124', and a hard mask layer 126' are formed stacked in that order over the semiconductor substrate 104 along a second, back side of the substrate 104. The first dielectric 110 may be, for example, formed of an oxide, such as silicon dioxide. The metal layer 122' may be, for example, formed of tungsten, copper, or aluminum copper. The low-n layer 124' may be, for example, formed of a material with a refractive index less than the refractive index of color filters formed hereafter. In some embodiments, the low-n layer 124' is formed of oxide, hafnium oxide, or a material with a refractive index less than silicon. The hard mask layer 126' may be, for example, formed of silicon nitride or silicon oxynitride.

Figure 12:
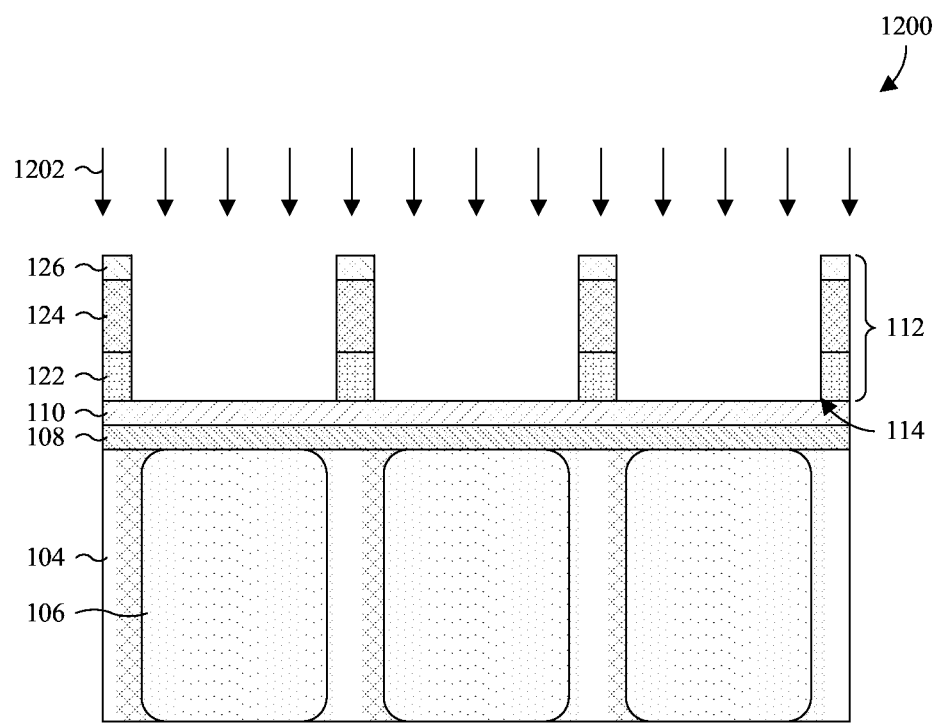

FIG. 12 illustrates a cross-sectional view 1200 of some embodiments corresponding to Act 906. As illustrated, an etch is performed to the first dielectric layer 110, through regions of the hard mask layer 126', the low-n layer 124', and the metal layer 122' overlying the photodiodes 106. The etch results in a composite grid 112 arranged around openings 114 overlying the photodiodes 106. The composite grid 112 includes a metal grid 122, a low-n grid 124, and a hard mask grid 126 stacked in that order around the openings 114. Typically, the opening 114 and the photodiodes 106 share approximately the same footprint. Further, the openings 114 are typically centrally aligned with the photodiodes 106 so that the composite grid 112 is arranged around and between the photodiodes 106. However, in other embodiments, the openings 114 may be laterally shifted or offset in at least one direction from the photodiodes 106 so that the composite grid 112 at least partially overlies the photodiodes 106.

The process for performing the etch may include forming a photoresist layer masking regions of the hard mask layer 126' corresponding to the composite grid 112. An etchant may then be applied to the hard mask layer 126' according to a pattern of the photoresist layer, thereby defining the hard mask grid 126. The etchant may be selective of the hard mask layer 126' relative to the low-n layer 124'. With the hard mask grid 126 defined, the photoresist layer may be removed and one or more additional etchants 1202 may be applied to the low-n layer 124' and the metal layer 122' according to a pattern of the hard mask grid 126.

Figure 13:
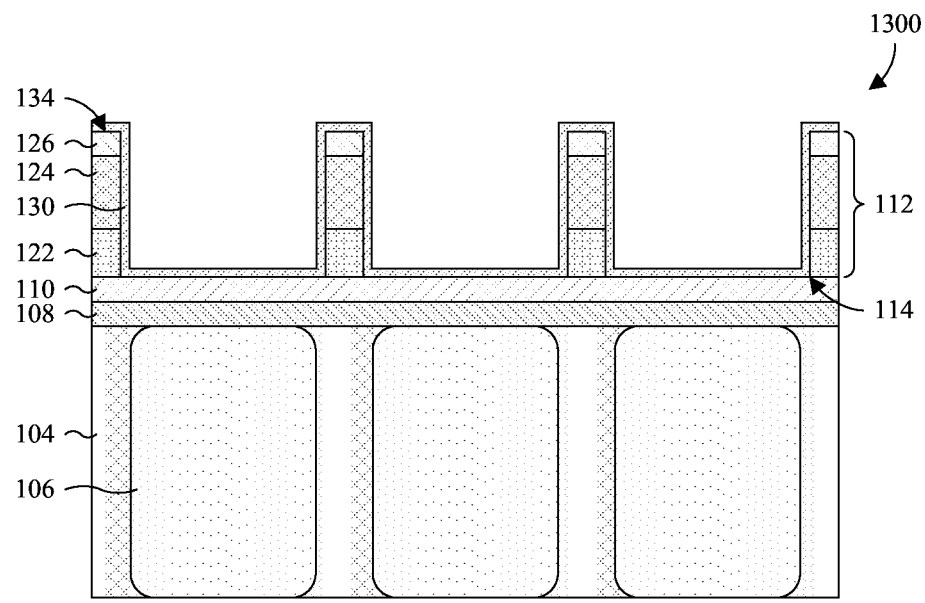

FIG. 13 illustrates a cross-sectional view 1300 of some embodiments corresponding to Act 908. As illustrated, a second dielectric layer 130 is formed lining an upper surface 134 of the composite grid 112, and lining the openings 114. Typically, the second dielectric layer 130 is formed using a conformal deposition technique, such as, for example, chemical vapor deposition (CVD) or physical vapor deposition (PVD). The second dielectric layer 130 may be, for example, formed of an oxide, such as silicon dioxide.

Figure 14A:
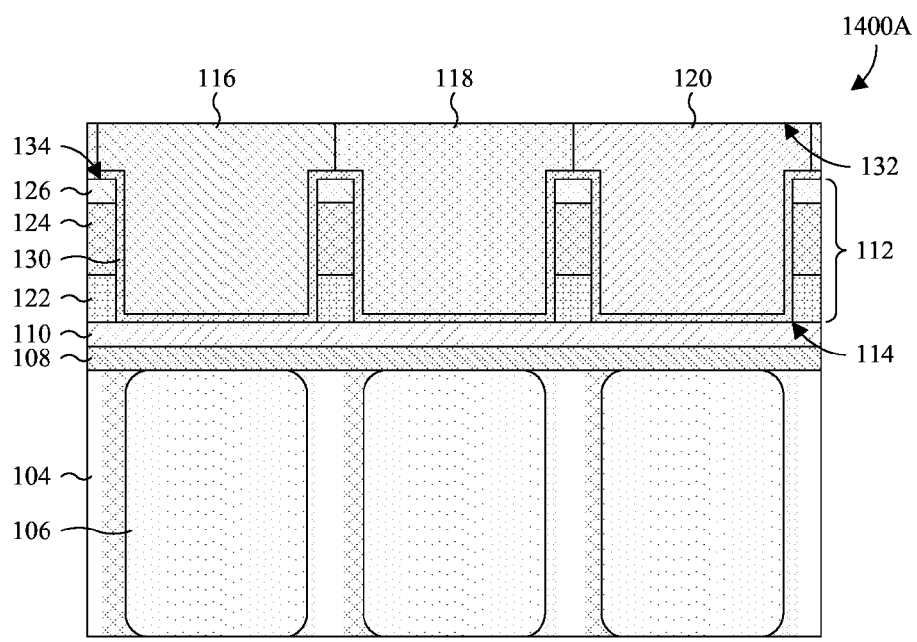

FIGS. 14A & B illustrate cross-sectional views 1400A, 1400B of some embodiments corresponding to Acts 910 and 912.

As illustrated by FIG. 14A, color filters 116, 118, 120 corresponding to pixel sensors are formed in the openings 114 of the corresponding pixel sensors. Further, the color filters 116, 118, 120 are formed with assigned colors. Typically, the color filters 116, 118, 120 are alternatingly formed with assigned colors of red, green, and blue. Therefore, the color filters 116, 118, 120 typically include red color filters 116, green color filters 118, and blue color filters 120. The color filters 116, 118, 120 are also formed with upper surfaces 132 that are higher than the upper surface 134 of the composite grid 112 and that overhang the upper surface 134 of the composite grid 112. As discussed above, this reduces light collection by the low-n grid 124, thereby reducing cross talk between neighboring pixel sensors.

In some embodiments, as illustrated, the color filters 116, 118, 120 fill the openings 114 of the corresponding pixel sensors and are symmetrical about vertical axes aligned with photodiode centers of the corresponding pixel sensors. In such embodiments, the color filters 116, 118, 120 typically overhang the composite grid upper surface 134 around the openings 114 of the corresponding pixel sensors, and neighboring sidewalls of the overhangs typically abut. In other embodiments, the color filters 116, 118, 120 are laterally shifted or offset in at least one direction from the photodiodes 106 of the corresponding pixel sensors. In such embodiments, the color filters 116, 118, 120 are asymmetrical about vertical axes aligned with photodiode centers of the corresponding pixel sensors. Further, the color filters 116, 118, 120 overhang the composite grid upper surface 134 at least partially around the openings 114 of the corresponding pixel sensors. Depending upon the extent of the shift or offset, the color filters 116, 118, 120 may partially fill the openings of the corresponding pixel sensors and may partially fill the openings of pixel sensors neighboring the corresponding pixel sensors.

The process for forming the color filters 116, 118, 120 may include, for each of the different colors of the color assignments, forming a color filter layer and patterning the color filter layer. The color filter layer is formed so as to fill exposed regions of the openings 114 and to cover exposed regions of the composite grid upper surface 134. The color filter layer is formed of a material that allows light of the corresponding color to pass therethrough, while blocking light of other colors. Further, in some embodiments, the color filter layer is planarized subsequent to formation. The patterning may be performed by forming a photoresist layer with a pattern over the color filter layer, applying an etchant to the color filter layer according to the pattern of the photoresist layer, and removing the pattern photoresist layer.

Figure 14B:
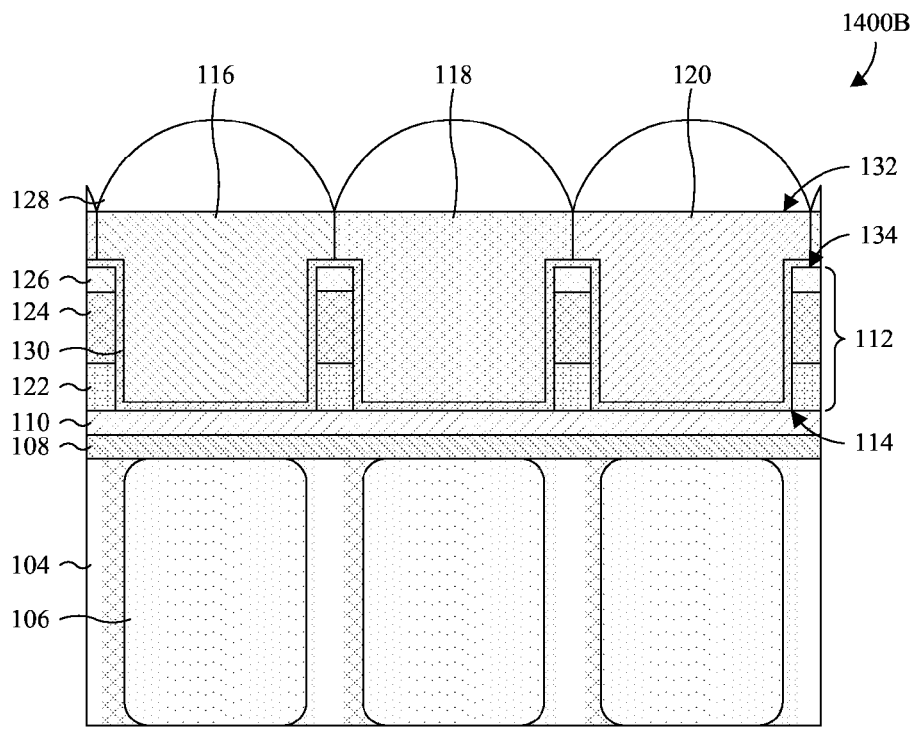

As illustrated by FIG. 14B, micro lenses 128 corresponding to the pixel sensors are formed over the color filters 116, 118, 120 of the corresponding pixel sensors. In some embodiments, the micro lenses 128 may be laterally shifted or offset in at least one direction from the photodiodes 106.

Figure 15A:
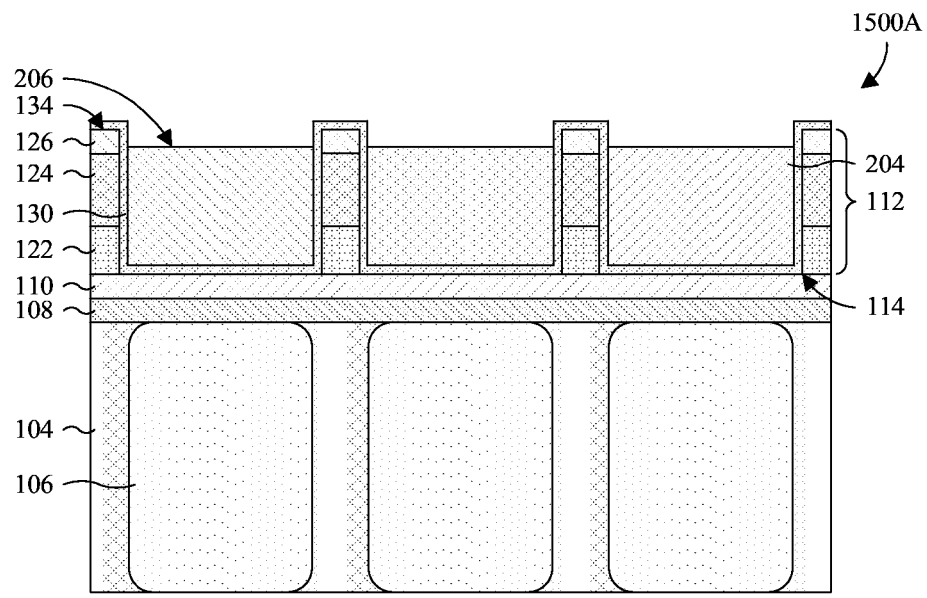

FIGS. 15A & B illustrate cross-sectional views 1500A, 1500B of other embodiments corresponding to Acts 910 and 912.

As illustrated by FIG. 15A, color filters 204 corresponding to the pixel sensors are formed in the openings 114 of the corresponding pixel sensors. Further, the color filters 204 are formed with upper surfaces 206 recessed relative to the upper surface 134 of the composite grid 112. This advantageously increases light collection by the low-n grid 124. Even more, the color filters 204 are formed with assigned colors. Typically, the color filters are alternatingly formed with assigned colors of red, green, and blue.

The process for forming the color filters 204 may include, for each of the different colors of the color assignments, forming a color filter layer and patterning the color filter layer. The color filter layer may be formed so as to fill exposed openings and to cover exposed regions of the composite grid upper surface. The color filter layer may then be planarized and/or etched back to about even with the composite grid upper surface 134, before patterning. The patterning may be performed by forming a photoresist layer with a pattern over the color filter layer, applying an etchant to the color filter layer according to the pattern of the photoresist layer, and removing the pattern photoresist layer. By applying the etchant, an upper surface of the color filter layer is recessed relative to the composite grid upper surface 134.

Figure 15B:
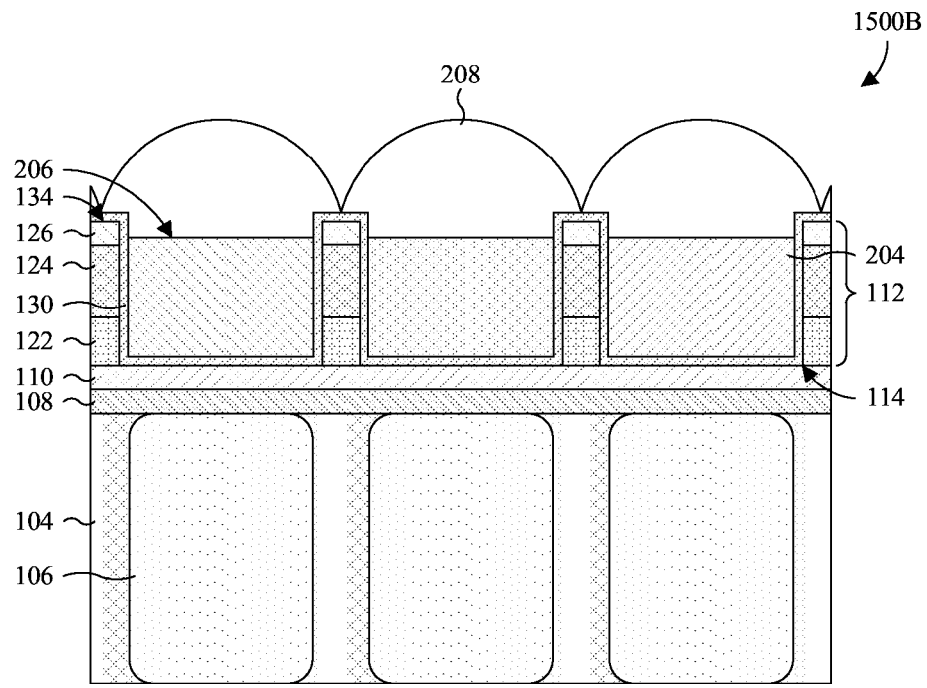

As illustrated by FIG. 15B, micro lenses 208 corresponding to the pixel sensors are formed over the color filters 204 of the corresponding pixel sensors. Further, the micro lenses 208 are formed in remaining regions of the openings 114 and overhanging the upper surface 134 of the composite grid 112. In some embodiments, as illustrated, the micro lenses 208 fill remaining regions of the openings 114 and are symmetrical about vertical axes aligned with photodiode centers of the corresponding pixel sensors. In such embodiments, the micro lenses 208 typically overhang the composite grid upper surface 134 around the openings 114 of the corresponding pixel sensors and neighboring edges of the overhangs typically abut. In other embodiments, the micro lenses 208 are laterally shifted or offset in at least one direction from the photodiodes 106 of the corresponding pixel sensors. In such embodiments, the micro lenses 208 are asymmetrical about vertical axes aligned with photodiode centers of the corresponding pixel sensors. Further, the micro lenses 208 overhang the composite grid upper surface 134 at least partially around the openings 114 of the corresponding pixel sensors. Depending upon the extent of the shift or offset, the micro lenses 208 may partially fill the openings of the corresponding pixel sensors and may partially fill the openings of pixel sensors neighboring the corresponding pixel sensors. The micro-lenses 208 may be formed according to conventional approaches.

Figure 16:
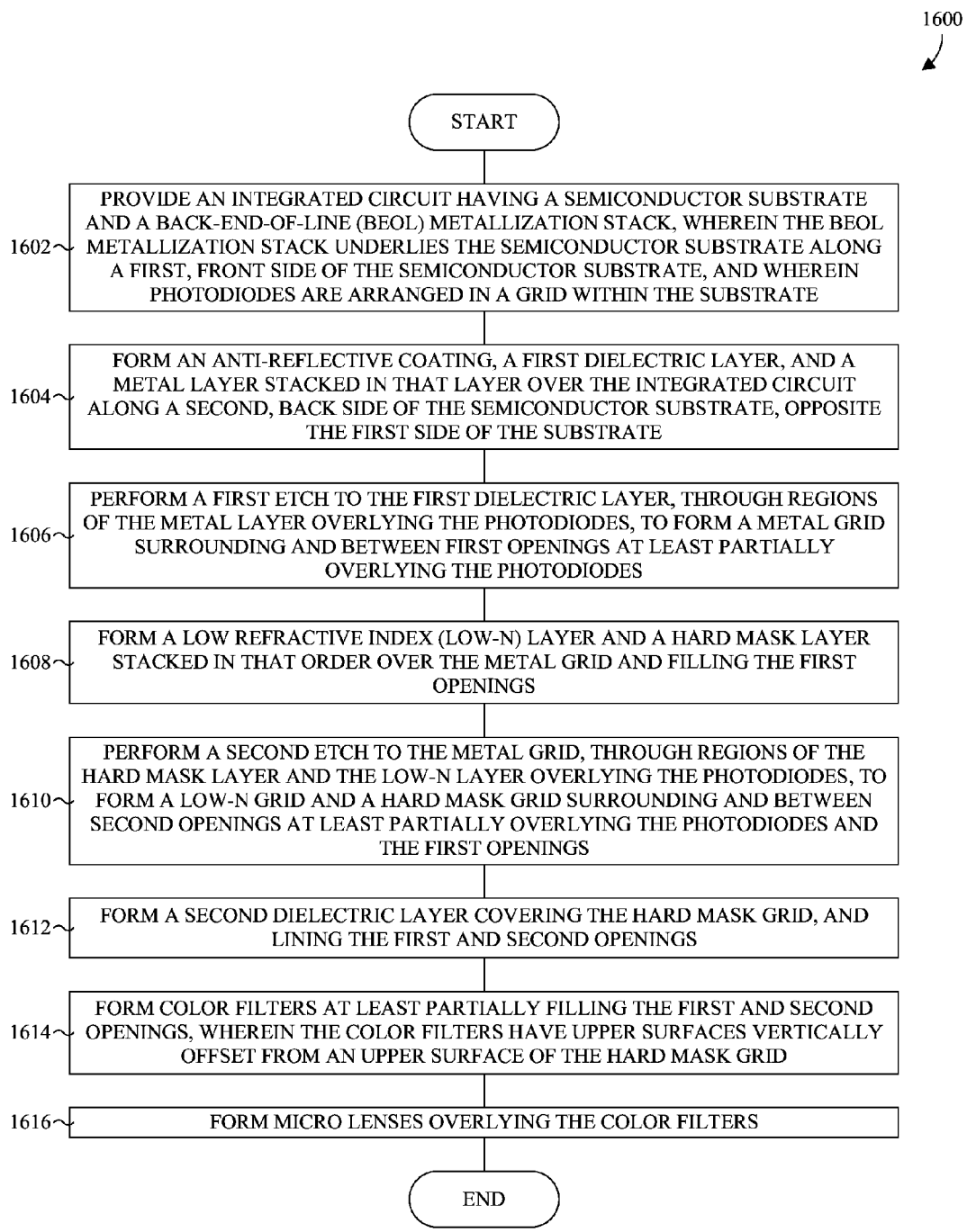
FIG. 16 illustrates a flowchart of other more detailed embodiments of the method of FIG. 8 in which a semiconductor structure for shifted BSI pixel sensors is manufactured.

With reference to FIG. 16, a flowchart 1600 of other more detailed embodiments of the method of FIG. 8 is provided. As seen hereafter, the more detailed embodiments are directed to shifted BSI pixel sensors.

At 1602, provide an integrated circuit having a semiconductor substrate and a BEOL metallization stack. The BEOL metallization stack underlies the semiconductor substrate along a first, front side of the semiconductor substrate, and photodiodes are arranged in a grid within the substrate.

At 1604, an anti-reflective coating, a first dielectric layer, and a metal layer are formed stacked in that layer over the integrated circuit. The stack is formed along a second, back side of the semiconductor substrate, opposite the first side of the substrate.

At 1606, a first etch is performed to the first dielectric layer, through regions of the metal layer overlying the photodiodes. The first etch forms a metal grid surrounding and between first openings at least partially overlying the photodiodes.

At 1608, a low-n layer and a hard mask layer are formed stacked in that order over the metal grid and filling the first openings. The low-n grid has a refractive index less than color filters formed hereafter.

At 1610, a second etch is performed to the metal grid, through regions of the hard mask layer and the low-n layer overlying the photodiodes. The second etch forms a low-n grid and a hard mask grid surrounding and between second openings at least partially overlying the photodiodes and the first openings.

At 1612, a second dielectric layer is formed covering the hard mask grid, and lining the first and second openings.

At 1614, color filters are formed at least partially filling the first and second openings. The color filters have upper surfaces vertically offset from an upper surface of the composite grid. For example, the color filters overhang the composite grid or the upper surfaces of the color filters are recessed relative to the upper surface of the composite grid.

At 1616, micro lenses are formed overlying the color filters.

With reference to FIGS. 17-22, 23A & B, and 24A & B, cross-sectional views of some embodiments of a semiconductor structure for BSI pixel sensors at various stages of manufacture are provided to illustrate the method of FIG. 16. Although FIGS. 17-22, 23A & B, and 24A & B are described in relation to the method, it will be appreciated that the structures disclosed in FIGS. 17-22, 23A & B, and 24A & B are not limited to the method, but instead may stand alone as structures independent of the method. Similarly, although the method is described in relation to FIGS. 17-22, 23A & B, and 24A & B, it will be appreciated that the method is not limited to the structures disclosed in FIGS. 17-22, 23A & B, and 24A & B, but instead may stand alone independent of the structures disclosed in FIGS. 17-22, 23A & B, and 24A & B.

Figure 17:
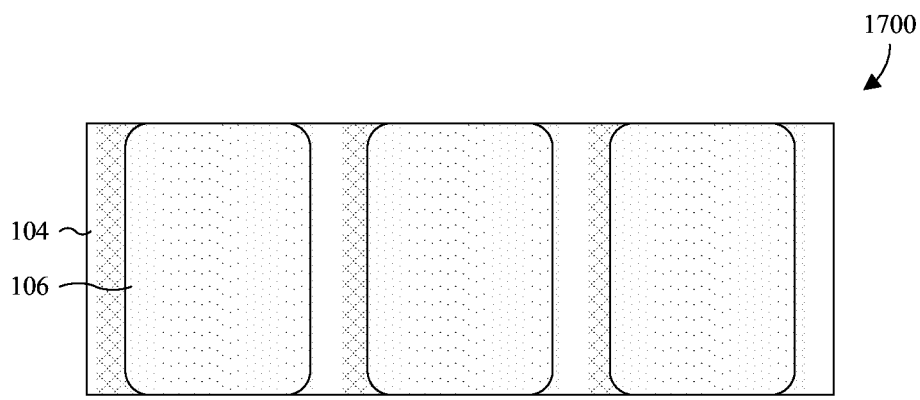
FIGS. 17-22, 23A & B, and 24A & B illustrate a series of cross-sectional views of some embodiments of the semiconductor structure of FIG. 16 at various stages of manufacture.

FIG. 17 illustrates a cross-sectional view 1700 of some embodiments corresponding to Act 1602. As illustrated, a semiconductor substrate 104 with photodiodes 106 arranged therein is provided. The photodiodes 106 correspond to pixel sensors. In some embodiments, the semiconductor substrate 104 is part of an integrated circuit. In such embodiments, a BEOL metallization stack (not shown) of the integrated circuit underlies the semiconductor substrate 104 along a first, front side of the substrate 104. The semiconductor substrate 104 may be, for example, a bulk semiconductor substrate or an SOI substrate.

Figure 18:
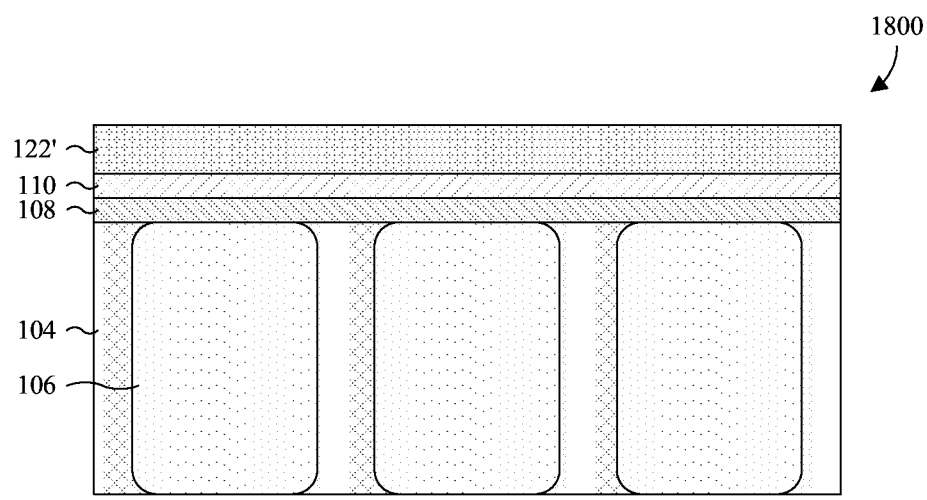

FIG. 18 illustrates a cross-sectional view 1800 of some embodiments corresponding to Act 1604. As illustrated, an ARC 108, a first dielectric layer 110, and a metal layer 122' are formed stacked in that order over the semiconductor substrate 104 along a second, back side of the substrate 104. The first dielectric layer 110 may be, for example, formed of an oxide. The metal layer 122' may be, for example, formed of tungsten, copper, or aluminum copper.

Figure 19:
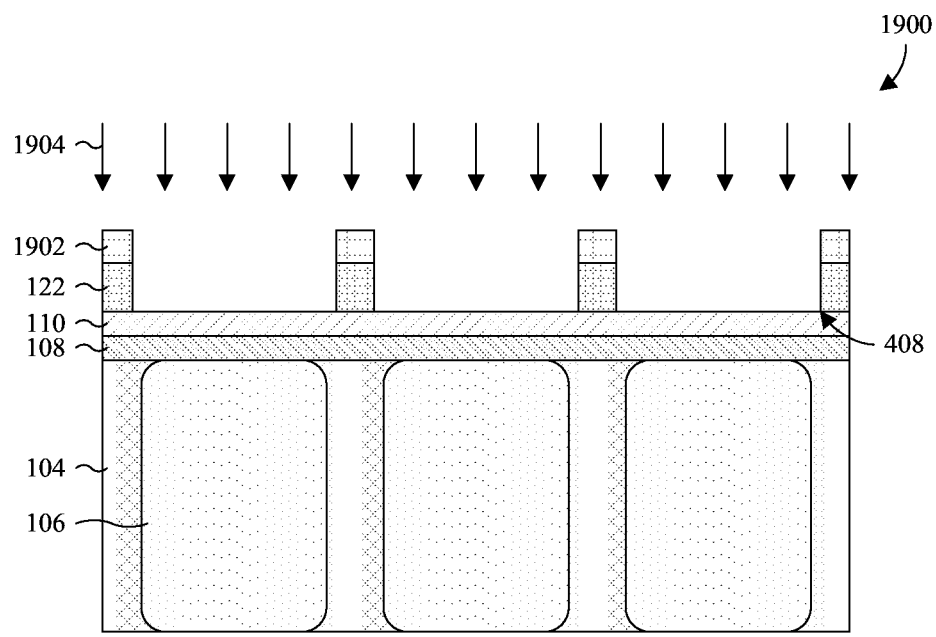

FIG. 19 illustrates a cross-sectional view 1900 of some embodiments corresponding to Act 1606. As illustrated, a first etch is performed to the first dielectric layer 110, through regions of the metal layer 122' overlying the photodiodes 106. The first etch results in a metal grid 122 arranged around first openings 408 overlying the photodiodes 106. Typically, the first openings 408 and the photodiodes 106 share approximately the same footprint. Further, the first openings 408 are typically centrally aligned with the photodiodes 106 so that the metal grid 122 is arranged around and between the photodiodes 106. However, in other embodiments, the first openings 408 may be laterally shifted or offset in at least one direction from the photodiodes 106 so that the metal grid 122 at least partially overlies the photodiodes 106.

The process for performing the first etch may include forming a photoresist layer 1902 masking regions of the metal layer 122' corresponding to the metal grid 122. An etchant 1904 may then be applied to the metal layer 122' according to a pattern of the photoresist layer 1902, thereby defining the metal grid 122. The etchant 1904 may be selective of the metal layer 122' relative to the first dielectric layer 110. With the metal grid 122 defined, the photoresist layer 1902 may be removed.

Figure 20:
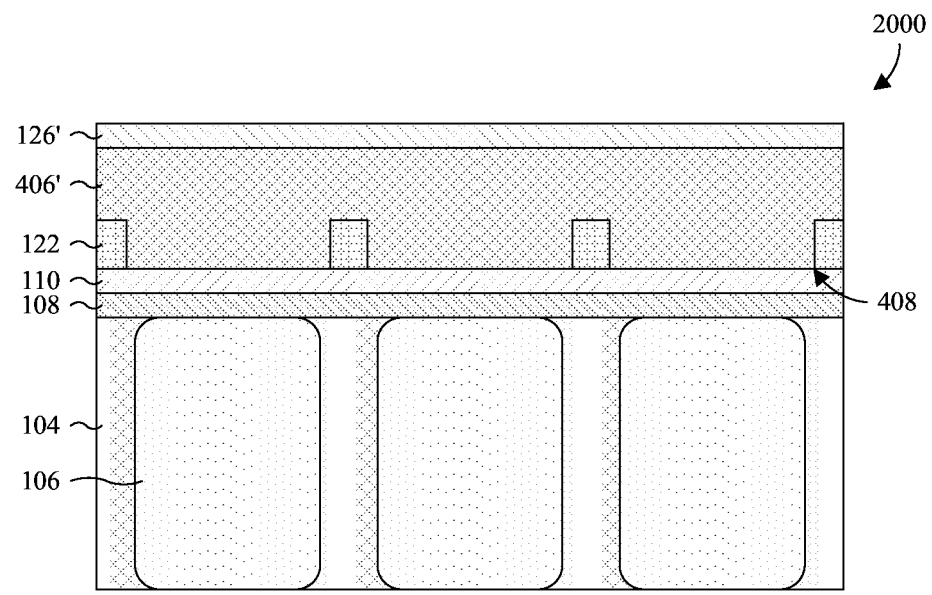

FIG. 20 illustrates a cross-sectional view 2000 of some embodiments corresponding to Act 1608. As illustrated, a low-n layer 406' and a hard mask layer 126' are formed stacked in that order over the first dielectric layer 110 and the metal grid 122. Further, the low-n layer 406' is formed filling the first openings 408. In some embodiments, the process for forming the low-n layer 406' includes depositing an intermediate layer and planarizing the intermediate layer using a chemical mechanical polish (CMP). The low-n layer 406' is formed of a material with a refractive index less than the refractive index of color filters formed hereafter. In some embodiments, the low-n layer 406' is formed of oxide, hafnium oxide, or a material with a refractive index less than silicon. The hard mask layer 126' may be, for example, formed of silicon nitride or silicon oxynitride.

Figure 21:
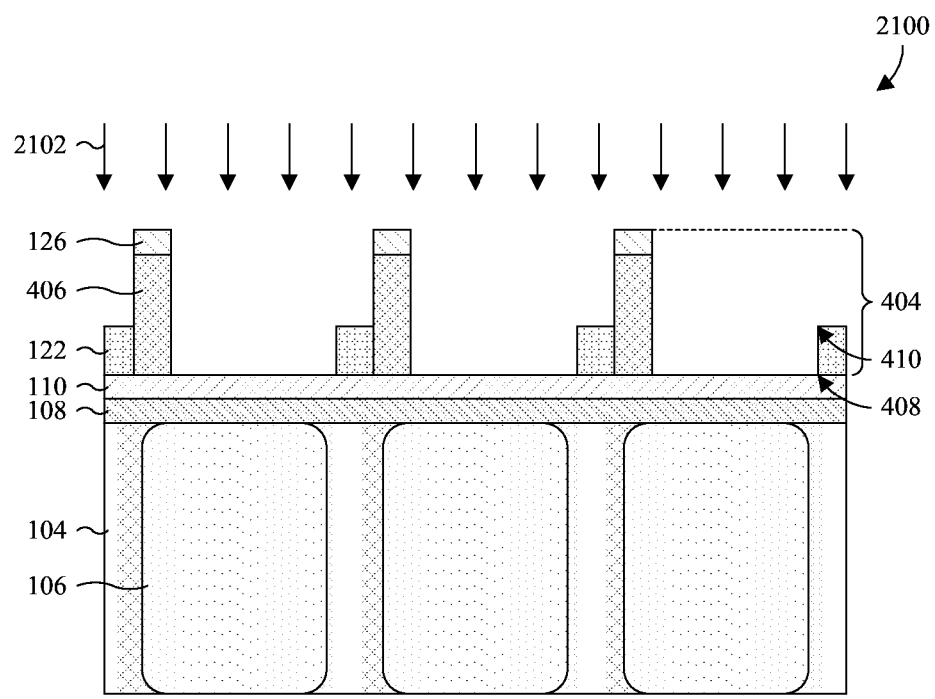

FIG. 21 illustrates a cross-sectional view 2100 of some embodiments corresponding to Act 1610. As illustrated, a second etch is performed to the first dielectric layer 110, through regions of the hard mask layer 126' and the low-n layer 406' overlying the photodiodes 106. The second etch results in a low-n grid 406 and a hard mask grid 126 stacked in that order, and arranged around second openings 410 overlying the photodiodes 106. The second openings 410 are laterally shifted or offset in at least one direction from the photodiodes 106 so sidewalls of the low-n grid 406 abut sidewalls of the metal grid 122. Typically, the second opening 410 and the photodiodes 106 share approximately the same footprint. The hard mask grid 126, the low-n grid 406, and the metal grid 122 collectively define a composite grid 404.

The process for performing the second etch may include forming a photoresist layer masking regions of the hard mask layer 126' corresponding to the hard mask grid 126. An etchant 1202 may then be applied to the hard mask layer 126' according to a pattern of the photoresist layer, thereby defining the hard mask grid 126. The etchant may be selective of the hard mask layer 126' relative to the low-n layer 406'. With the hard mask grid 126 defined, the photoresist layer may be removed and an additional etchant 1202 may be applied to the low-n layer 406' according to a pattern of the hard mask grid 126.

Figure 22:
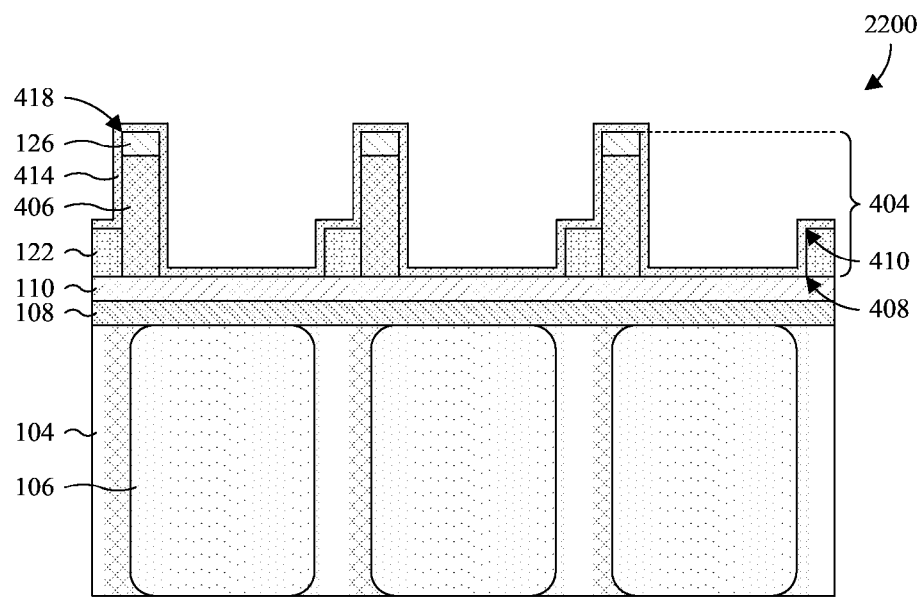

FIG. 22 illustrates a cross-sectional view 2200 of some embodiments corresponding to Act 1612. As illustrated, a second dielectric layer 414 is formed lining an upper surface 418 of the composite grid 404, and lining the first and second openings 408, 410. Typically, the second dielectric layer 414 is formed using a conformal deposition technique. The second dielectric layer 414 may be, for example, formed of an oxide, such as silicon dioxide.

Figure 23A:
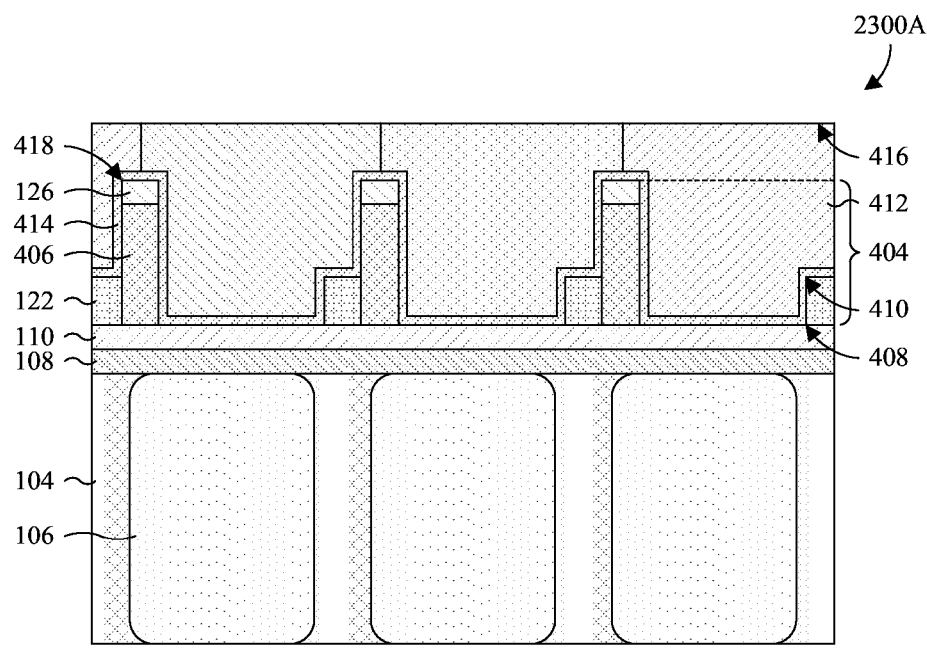

FIGS. 23A & B illustrate cross-sectional views 2300A, 2300B of some embodiments corresponding to Acts 1614 and 1616.

As illustrated by FIG. 23A, color filters 412 corresponding to the pixel sensors are formed in the first and second openings 408, 410 of the corresponding pixel sensors. Further, the color filters 412 are formed with assigned colors. Typically, the color filters 412 are alternatingly formed with assigned colors of red, green, and blue. The color filters 412 are also formed with upper surfaces 416 that are higher than the upper surface 418 of the composite grid 404 and that overhang the upper surface 418 of the composite grid 404. As discussed above, this reduces light collection by the low-n grid 406, thereby reducing cross talk between neighboring pixel sensors.

In some embodiments, as illustrated, the color filters 412 fill the first and second openings 408, 410 of the corresponding pixel sensors and have stepped profiles. In such embodiments, the color filters 412 typically overhang the composite grid upper surface 418 around the second openings 410 of the corresponding pixel sensors. Further, neighboring sidewalls of the overhangs typically abut. In other embodiments, the color filters 412 are laterally shifted or offset in at least one direction from the photodiodes 106 of the corresponding pixel sensors. In such embodiments, the color filters 412 overhang the composite grid upper surface 418 at least partially around the second openings 410 of the corresponding pixel sensors. Further, depending upon the extent of the shift or offset, the color filters 412 may partially fill the first and second openings of the corresponding pixel sensors and may partially fill the first and second openings of pixel sensors neighboring the corresponding pixel sensors.

The process for forming the color filters 412 may include, for each of the different colors of the color assignments, forming a color filter layer and patterning the color filter layer. The color filter layer may be formed so as to fill exposed regions of the first and second openings 408, 410 and to cover exposed regions of the composite grid upper surface 418. In some embodiments, the color filter layer is planarized subsequent to formation.

Figure 23B:
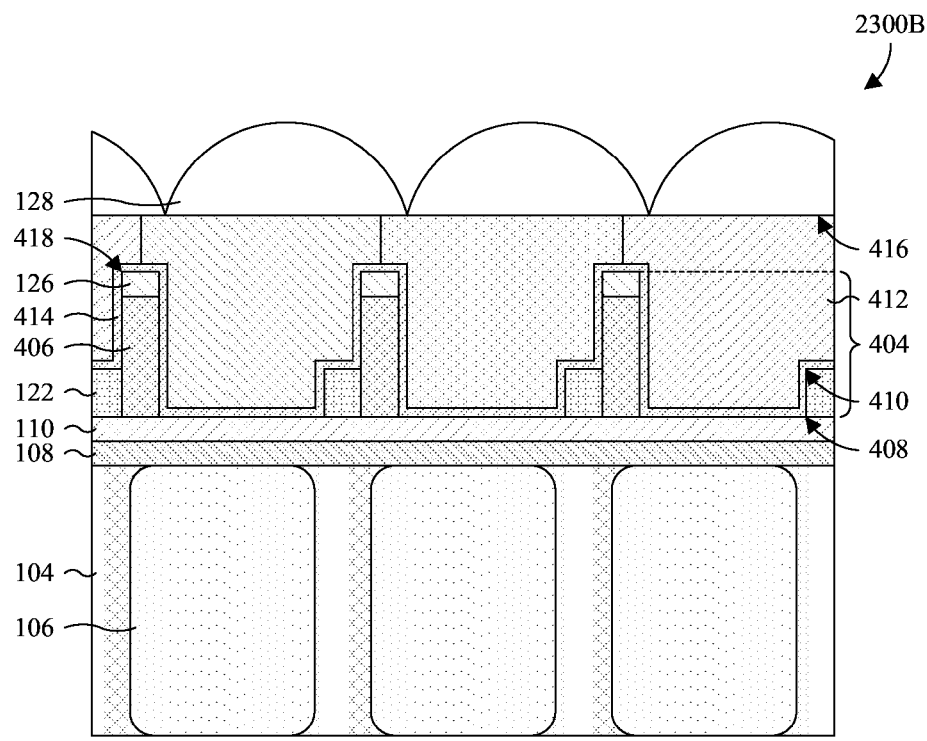

As illustrated by FIG. 23B, micro lenses 128 corresponding to the pixel sensors are formed over the color filters 412 of the corresponding pixel sensors. The micro lenses 128 may be formed according to conventional approaches. Further, in some embodiments, the micro lenses 128 may be laterally shifted or offset in at least one direction from the photodiodes 106.

Figure 24A:
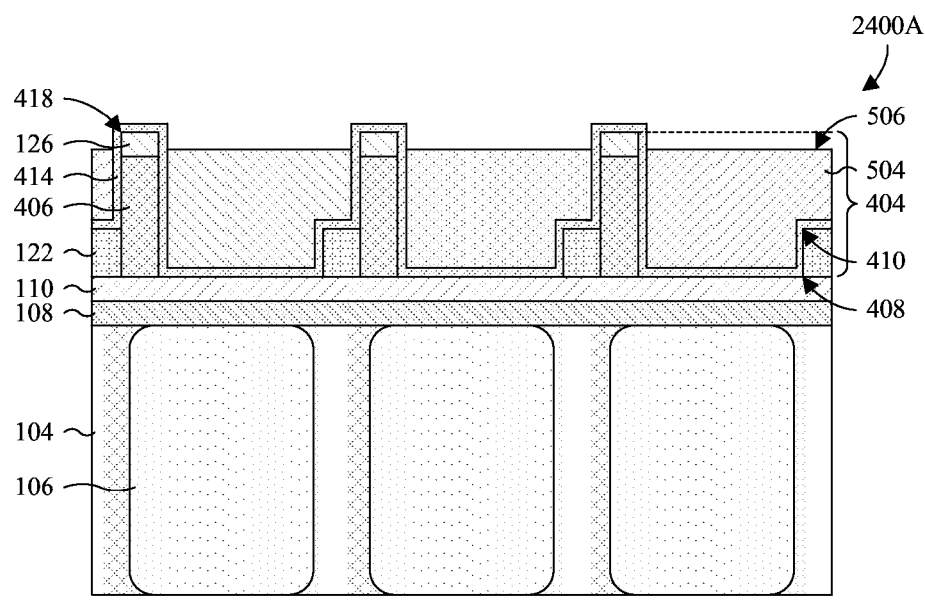

FIGS. 24A & B illustrate cross-sectional views 2400A, 2400B of other embodiments corresponding to Acts 1614 and 1616.

As illustrated by FIG. 24A, color filters 504 corresponding to the pixel sensors are formed in the first and second openings 408, 410 of the corresponding pixel sensors. Further, the color filters 504 are formed with upper surfaces 506 recessed relative to the upper surface 418 of the composite grid 404. Even more, the color filters 504 are formed with assigned colors. Typically, the color filters are alternatingly formed with assigned colors of red, green, and blue.

The process for forming the color filters 504 may include, for each of the different colors of the color assignments, forming a color filter layer and patterning the color filter layer. The color filter layer may be formed so as to fill exposed regions of the first and second openings 408, 410 and to cover exposed regions of the composite grid upper surface 418. The color filter layer may then be planarized and/or etched back to about even with the composite grid upper surface 418, before patterning the color filter layer.

Figure 24B:
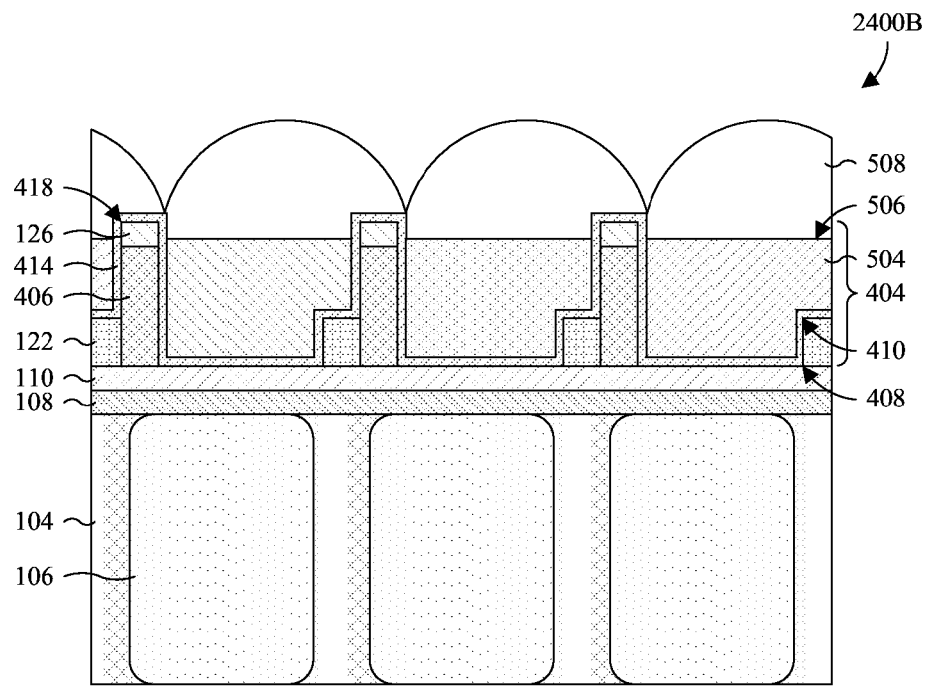

As illustrated by FIG. 24B, micro lenses 508 corresponding to the pixel sensors are formed over the color filters 504 of the corresponding pixel sensors. Further, the micro lenses 508 are formed in remaining regions of the first and second openings 408, 410, and overhanging the upper surface 418 of the composite grid 404. In some embodiments, as illustrated, the micro lenses 508 fill remaining regions of the first and second openings 408, 410 of the corresponding pixel sensors. In such embodiments, the micro lenses 508 typically overhang the composite grid upper surface 418 around the second openings 410 of the corresponding pixel sensors. Further, neighboring edges of the overhangs typically abut. In other embodiments, the micro lenses 508 are laterally shifted or offset in at least one direction from the photodiodes 106 of the corresponding pixel sensors. In such embodiments, the micro lenses 508 overhang the composite grid upper surface 418 at least partially around the second openings 410 of the corresponding pixel sensors. Depending upon the extent of the shift or offset, the micro lenses 508 may partially fill remaining regions of the second openings of the corresponding pixel sensors and may partially fill remaining regions of the second openings of pixel sensors neighboring the corresponding pixel sensors. The micro lenses 508 may be formed according to conventional approaches.

Thus, as can be appreciated from above, the present disclosure provides a semiconductor structure for BSI pixel sensors. Photodiodes are arranged within a semiconductor substrate. A composite grid includes a metal grid and a low refractive index (low-n) grid. The metal grid includes first openings overlying the semiconductor substrate and corresponding to ones of the photodiodes. The low-n grid includes second openings overlying the semiconductor substrate and corresponding to ones of the photodiodes. Color filters are arranged in the first and second openings of the corresponding photodiodes and have a refractive index greater than a refractive index of the low-n grid. Upper surfaces of the color filters are offset relative to an upper surface of the composite grid.

In other embodiments, the present disclosure provides a method for manufacturing a semiconductor structure for BSI pixel sensors. Photodiodes are formed within a semiconductor substrate. A metal layer, a low-n layer, and a hard mask layer are formed stacked in that order over the semiconductor substrate. An etch is performed through regions of the metal layer, the low-n layer, and the hard mask layer overlying the photodiodes to form a composite grid with openings overlying corresponding ones of the photodiodes. The composite grid includes a metal grid, a low-n grid, and a hard mask grid stacked in that order. Color filters are formed in the openings over the corresponding photodiodes. The color filters are formed with upper surfaces offset relative to an upper surface of the composite grid and have a refractive index that is greater than a refractive index of the low-n layer.

In yet other embodiments, the present disclosure provides a method for manufacturing a semiconductor structure for BSI pixel sensors. A semiconductor substrate is provided with photodiodes arranged within the semiconductor substrate. A metal layer is formed over the semiconductor substrate. A first etch is performed through regions of the metal layer overlying the photodiodes to form a metal grid with first openings overlying corresponding ones of the photodiodes. A low-n layer and a hard mask layer are formed stacked in that order over the metal grid, and filling the first openings. A second etch is performed through regions of the low-n layer and the hard mask layer overlying the photodiodes to respectively form a low-n grid and a hard mask grid collectively defining second openings overlying corresponding ones of the photodiodes. Color filters are formed in the first and second openings over the corresponding photodiodes. The color filters are formed with upper surfaces offset relative to an upper surface of the hard mask grid and have a refractive index that is greater than a refractive index of the low-n layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure for back side illumination (BSI) pixel sensors, the semiconductor structure comprising:
   photodiodes arranged within a semiconductor substrate;
   a composite grid including:
      a metal grid including first openings overlying the semiconductor substrate and corresponding to the photodiodes; and
      a low refractive index (low-n) grid including second openings overlying the semiconductor substrate and corresponding to the photodiodes; and
   color filters arranged in the first and second openings and having a refractive index greater than a refractive index of the low-n grid, wherein upper surfaces of the color filters are offset relative to an upper surface of the composite grid.

2. The semiconductor structure according to claim 1, wherein the upper surfaces of the color filters overhang the upper surface of the composite grid.

3. The semiconductor structure according to claim 1, wherein the upper surfaces of the color filters are recessed relative to the upper surface of the composite grid.

4. The semiconductor structure according to claim 1, further including:
   an integrated circuit comprising the semiconductor substrate and a back-end-of-line (BEOL) metallization stack underlying the semiconductor substrate.

5. The semiconductor structure according to claim 1, wherein the metal grid and the low-n grid share a layout, and wherein the low-n grid overlies the metal grid.

6. The semiconductor structure according to claim 1, wherein the first openings, the second openings, and the photodiodes share a footprint, and wherein the first and second openings are centered on centers of the corresponding photodiodes.

7. The semiconductor structure according to claim 1, wherein the first openings and the second openings are laterally offset from the photodiodes, so that the metal grid and the low-n grid partially mask the photodiodes.

8. The semiconductor structure according to claim 1, wherein the metal grid and the low-n grid share a layout, and wherein the low-n grid is laterally offset from the metal grid so sidewalls of the metal and low-n grids abut.

9. The semiconductor structure according to claim 1, wherein one of the color filters partially fills the first and second openings corresponding to a first one of the photodiodes, and partially fills the first and second openings corresponding to a second one of the photodiodes that neighbors the first one of the photodiodes.

10. A semiconductor structure for back side illumination (BSI) pixel sensors, the semiconductor structure comprising:
   a semiconductor substrate arranged over a back-end-of-line (BEOL) metallization stack and accommodating photodiodes;
   a composite grid arranged over the semiconductor substrate and comprising a dielectric grid and a conductive grid, wherein the dielectric and conductive grids border and collectively define openings overlying corresponding ones of the photodiodes; and
   color filters arranged in the openings and having top surfaces that are vertically offset from a top surface of the composite grid.

11. The semiconductor structure according to claim 10, wherein the dielectric grid has a low refractive index relative to the color filters.

12. The semiconductor structure according to claim 10, wherein the conductive and dielectric grids have a same layout and are arranged such that sidewalls of the conductive grid are aligned with sidewalls of the dielectric grid, and wherein a bottom surface of the dielectric grid is arranged over a top surface of the conductive grid.

13. The semiconductor structure according to claim 12, wherein one of the color filters has a top surface elevated relative to the top surface of the composite grid, and wherein the one of the color filters further overhangs the top surface of the composite grid on opposite sides of a corresponding one of the openings.

14. The semiconductor structure according to claim 12, wherein one of the color filters has a top surface recessed below the top surface of the composite grid.

15. The semiconductor structure according to claim 12, wherein one of the color filters has a top surface elevated relative to the top surface of the composite grid, and wherein the one of the color filters straddles a segment of the composite grid that separates neighboring ones of the openings.

16. The semiconductor structure according to claim 10, wherein the conductive grid is arranged laterally adjacent to the dielectric grid, and wherein the openings individually have a stepped profile and are asymmetric about vertical axes arranged respectively at width-wise centers of the openings.

17. The semiconductor structure according to claim 16, wherein one of the color filters has a top surface elevated relative to the top surface of the composite grid, and wherein the one of the color filters further overhangs the top surface of the composite grid on opposite sides of a corresponding one of the openings.

18. The semiconductor structure according to claim 16, wherein one of the color filters has a top surface recessed below the top surface of the composite grid.

19. The semiconductor structure according to claim 10, wherein the composite grid further comprises a hard mask grid overlying the dielectric grid and defining the top surface of the composite grid, and wherein the dielectric, conductive, and hard mask grids collectively define the openings.

20. A semiconductor structure for back side illumination (BSI) pixel sensors, the semiconductor structure comprising:
a semiconductor substrate arranged over a back-end-of-line (BEOL) metallization stack and accommodating photodiodes;
a composite grid arranged over the semiconductor substrate and comprising a dielectric grid, a conductive grid, and a hard mask grid, wherein the hard mask grid is arranged over the dielectric grid and has sidewalls aligned with sidewalls of the dielectric grid, and wherein the dielectric, conductive, and hard mask grids collectively define openings overlapping corresponding ones of the photodiodes;
a dielectric layer conformally lining the composite grid; and
color filters arranged in the openings and having top surfaces vertically offset from a top surface of the composite grid by more than a thickness of the dielectric layer.

* * * * *